US009800066B2

(12) United States Patent
Toya et al.

(10) Patent No.: US 9,800,066 B2
(45) Date of Patent: Oct. 24, 2017

(54) ELECTRICITY DISTRIBUTION DEVICE, AND CONTROLLING METHOD FOR BATTERY PACK

(71) Applicant: Panasonic Intellectual Property Management Co., Ltd., Osaka (JP)

(72) Inventors: Shoichi Toya, Hyogo (JP); Takeshi Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 256 days.

(21) Appl. No.: 14/807,549

(22) Filed: Jul. 23, 2015

(65) Prior Publication Data

US 2015/0333544 A1    Nov. 19, 2015

Related U.S. Application Data

(63) Continuation of application No. PCT/JP2014/004810, filed on Sep. 18, 2014.

(30) Foreign Application Priority Data

Sep. 27, 2013  (JP) .................................. 2013-202598

(51) Int. Cl.
  *H02J 7/00*    (2006.01)
  *H01M 10/48*   (2006.01)
  (Continued)

(52) U.S. Cl.
  CPC ........ *H02J 7/0026* (2013.01); *G01R 31/3634* (2013.01); *H01M 10/48* (2013.01);
  (Continued)

(58) Field of Classification Search
  USPC ........................................................ 320/112
  See application file for complete search history.

(56) References Cited

U.S. PATENT DOCUMENTS

| 6,294,894 B1* | 9/2001 | Ochiai ............... G01R 31/3658 320/132 |
| 2007/0120537 A1* | 5/2007 | Yamamoto ......... G01R 31/3679 320/150 |

(Continued)

FOREIGN PATENT DOCUMENTS

| JP | 2012-239357 | 12/2012 |
| WO | 2013/015192 | 1/2013 |

OTHER PUBLICATIONS

International Search Report of PCT application No. PCT/JP2014/004810 dated Nov. 25, 2014.

*Primary Examiner* — Robert Grant
(74) *Attorney, Agent, or Firm* — Greenblum & Bernstein, P.L.C.

(57) ABSTRACT

An electricity distribution device is connected to a system power supply and a battery pack, and includes: a primary power converter circuit converting DC electric power discharged from the battery pack into electric power supplied to the load; a first switch switching conducting and non-conducting states between the primary power converter circuit and the load; and a control circuitry controlling the first switch to switch the conducting and non-conducting states between the primary power converter circuit and the load. The primary power convertor circuit consumes DC electric power discharged from the battery pack, in a state where the first switch switches the non-conducting state between the primary power convertor circuit and the load, and a current value is acquired when discharging from the fully-charged state to an empty state. The fully-charged capacity of the battery pack is measured using the acquired current value.

20 Claims, 14 Drawing Sheets

(51) Int. Cl.
*H02J 3/32* (2006.01)
*G01R 31/36* (2006.01)
*H01M 10/42* (2006.01)

(52) U.S. Cl.
CPC .............. *H02J 3/32* (2013.01); *H02J 7/0021* (2013.01); *H02J 7/0024* (2013.01); *G01R 31/3679* (2013.01); *H01M 2010/4278* (2013.01); *H02J 7/0029* (2013.01)

(56) References Cited

U.S. PATENT DOCUMENTS

2013/0144547 A1* 6/2013 Yun .................... G01R 31/3624
702/63
2014/0159491 A1 6/2014 Kusunose

* cited by examiner

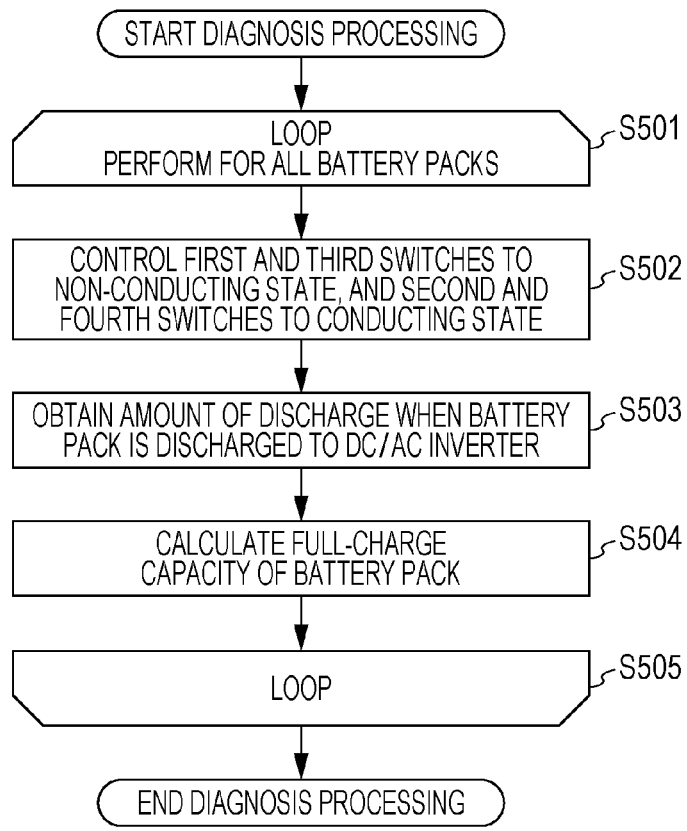
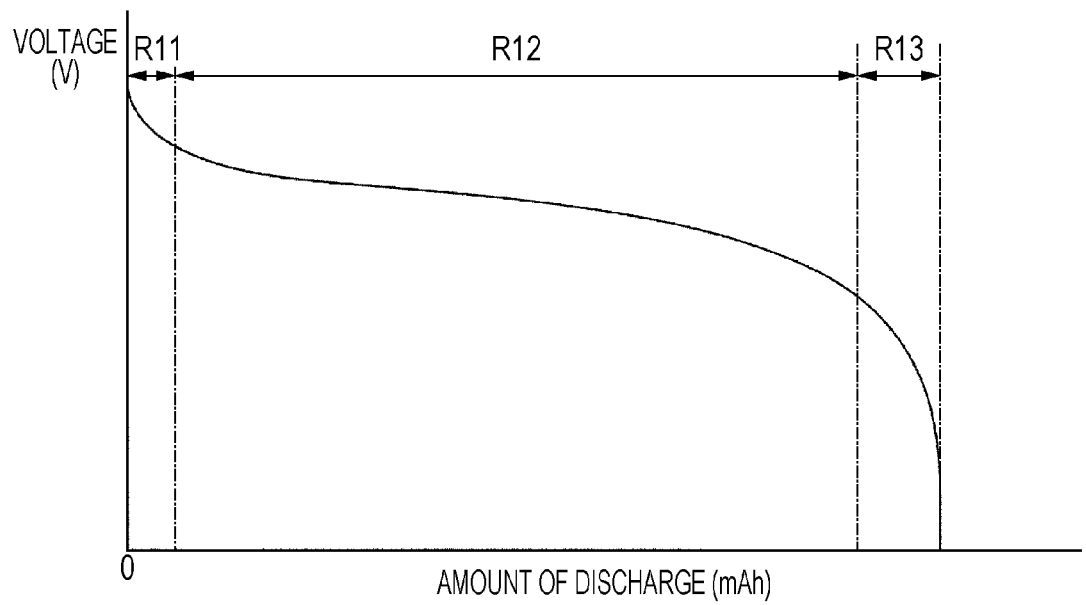

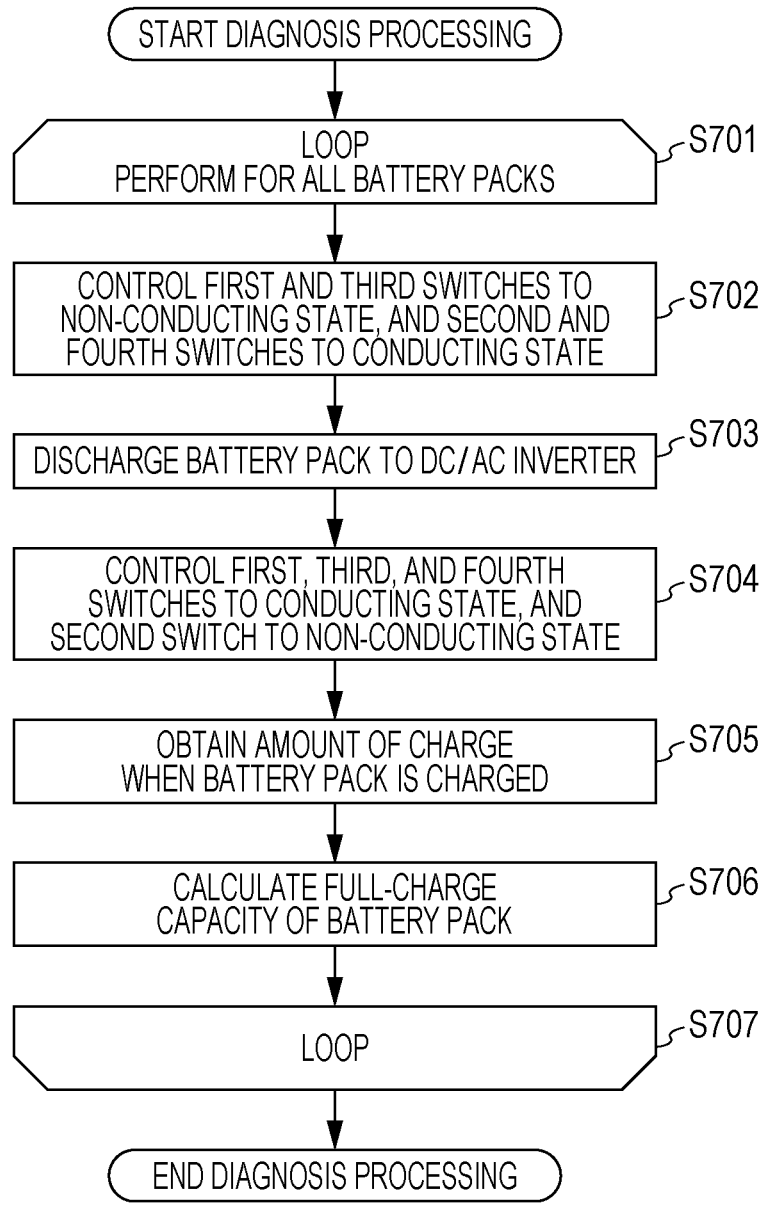

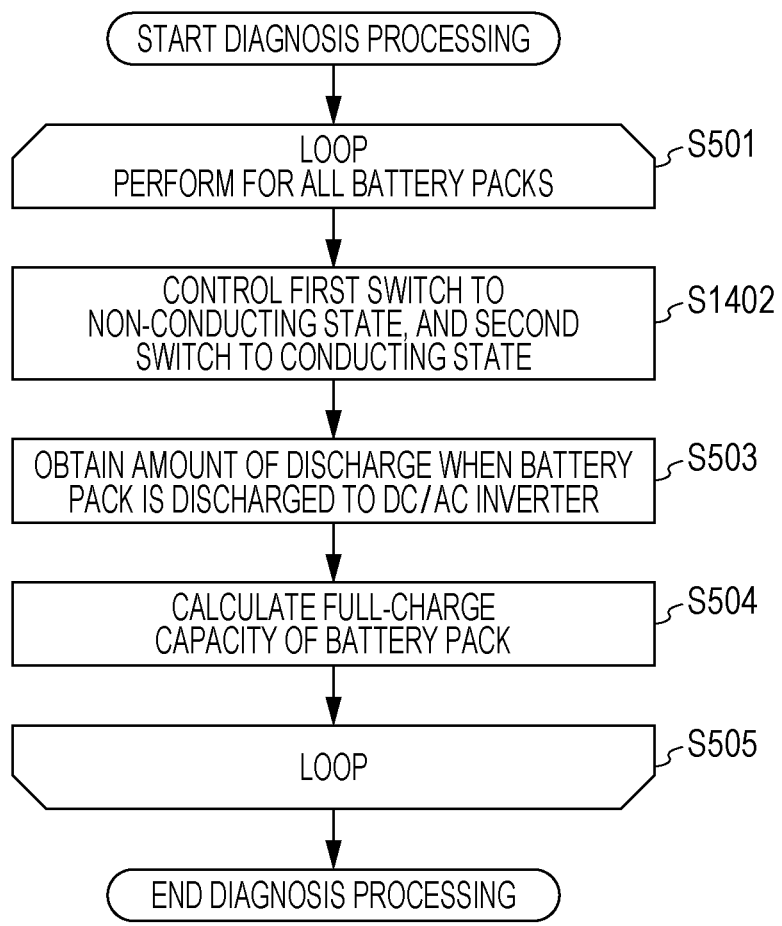

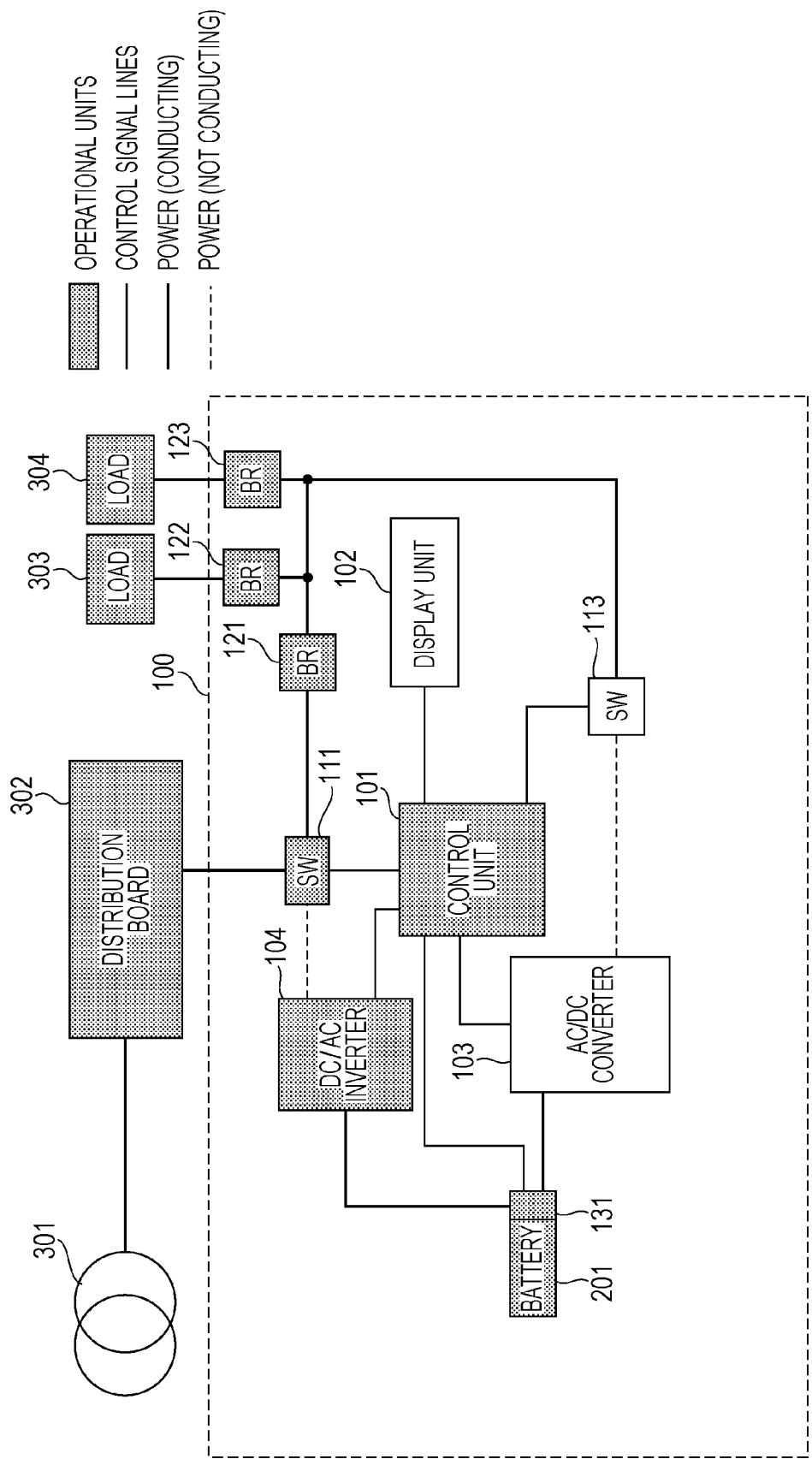

ELECTRICITY DISTRIBUTION DEVICE, AND CONTROLLING METHOD FOR BATTERY PACK

BACKGROUND

1. Technical Field

The present invention relates to an electricity distribution device connected to a system power supply, and capable of supplying power to a load from a power source other than the system power supply when performing self-sustained operations.

2. Description of the Related Art

In recent years, consumers are provided with system power supplies separate from distributed generation supplies such as battery devices, solar power generators, and so forth, and there are known system interconnection devices which perform system interconnection to supply power to the consumer from both the distributed generation supply and the other system power supply, or perform self-sufficient operation where the consumer is supplied with the distributed generation supply alone (e.g., see International Publication No. 2013/015192).

However, there has been demand in the conventional art for estimating the life expectancy of a battery back of the electricity distribution device without increasing the number of parts of the electricity distribution device.

SUMMARY

In one general aspect, the techniques disclosed here feature an electricity distribution device connected to a system power supply and a battery pack. The electricity distribution device includes:

a first connector connected to the battery pack;

a second connector connected to an externally-disposed load;

a primary power converter circuit operative to convert DC electric power discharged from the battery pack into electric power to be supplied to the load via the first connector;

a first switch operative to switch conducting and non-conducting states between the primary power converter circuit and the load; and a control circuitry operative to cause the first switch to conduct between the primary power converter circuit and the load.

In a case of performing diagnosis of the battery pack, the control circuitry causes the primary power convertor circuit to consume DC electric power discharged from the battery pack connected to the first connector, in a state where between the primary power convertor circuit and the load has been placed in a non-conducting state using the first switch, and acquires a current value over the time when discharging from the fully-charged state of the battery pack to an empty state, and measures the capacity of the battery pack in the fully-charged state using the acquired current value.

According to an aspect of the present disclosure, the life expectancy of the battery pack of the electricity distribution device can be estimated without increasing the number of parts of the electricity distribution device.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 is a circuit diagram of the electricity distribution device when performing self-sustaining operations where electric power is supplied from multiple battery packs to a load in an emergency such as a power outage or the like;

FIG. 5 is a flowchart illustrating an example of the electricity distribution device performing diagnosis processing of a battery pack;

FIG. 6 is a graph representing the relationship between voltage and state of charge (SOC) when a battery pack is discharged from a fully-charged state to an empty state;

FIG. 7 is a flowchart illustrating another example of the electricity distribution device performing diagnosis processing of a battery pack;

FIG. 14 is a flowchart illustrating an example of the electricity distribution device performing diagnosis processing of a battery pack, according to a seventh modification; and FIG. 15 is a circuit diagram of the electricity distribution device when performing diagnosis processing, in which FIG. 4 has been simplified.

DETAILED DESCRIPTION

Figure 1B:
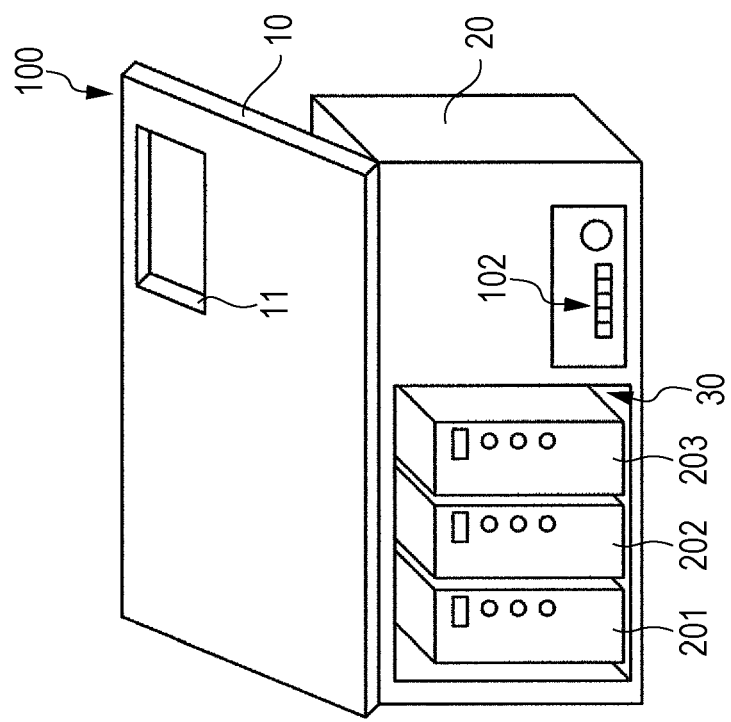
FIGS. 1A and 1B are external perspective views of an electricity distribution device according to an embodiment of the present disclosure.

Underlying Knowledge Forming Basis of the Present Disclosure

First, description will be made regarding points which the present inventors took note of. The present inventors studied a method for estimating the life expectancy of a battery pack, in an electricity distribution device connected to a system power supply and the battery pack, which supplies electric power output from the system power supply to a load during normal operations, and on the other hand supplies electric power output discharged from the battery pack to the load instead of from the system power supply in an emergency.

There is a method to estimate the life expectancy of the battery pack, where the current values when discharging the battery pack from a fully-charged state to an empty state are integrated, thus calculating the capacity of the battery pack when fully-charged, and thereby estimating the life expectancy of the battery pack (e.g., Japanese Unexamined Patent Application Publication No. 2012-239357).

However, the method to estimate the life expectancy of the battery pack disclosed in the above Japanese Unexamined Patent Application Publication No. 2012-239357 is realized by a dedicated device for life expectancy estimation.

Accordingly, in order to estimate the life expectancy of the battery pack, the dedicated device for life expectancy estimation is attached to the electricity distribution device, and information which the dedicated device has obtained from the battery pack is analyzed to estimate the life expectancy of the battery pack.

For example, while International Publication No. 2013/015192 is a malfunction diagnosis method which diagnoses malfunction of a distributed generation supply such as a solar cell, and/or malfunction of a system interconnection device that connects the distributed generation supply and the system power supply, and not a method for estimating the life expectancy of the battery pack, the disclosed is technology performing the diagnosis using a dedicated device.

The above International Publication No. 2013/015192 relates to a malfunction diagnosis method for diagnosis of malfunctioning of a system interconnection device configured to perform self-sustaining operations not interconnecting a distributed generation supply which is a solar cell to a system power supply, and also performing interconnected operations interconnecting the distributed generation supply to the system power supply.

In the above International Publication No. 2013/015192, the system interconnection device stops the interconnected operations when detecting an abnormality in the distributed generation supply, for example. In this case, the system interconnection device starts self-sustaining operations where the distributed generation supply which is a solar cell is not interconnected to the system power supply, and supplies electric power from the solar cell to a predetermined load (battery, storing power conditioner) (step A). Now, the system interconnection device has a dedicated controller built in, for diagnosing malfunctions. When electric power is supplied to the predetermined load in step A, the dedicated controller measures the state of electric power output from the distributed generation supply and/or system interconnection device (Step B). In a case where the state of electric power measured in step B does not satisfy predetermined conditions, the dedicated controller determines that a malfunction has occurred, and notifies the user of an error (step C).

Thus, in the malfunction diagnosis method according to International Publication No. 2013/015192, the system interconnection device is internally provided with a dedicated controller dedicated to diagnosing malfunctions, and verifies whether the distributed generation supply and/or the system interconnection device are operating properly, using the dedicated controller.

However, International Publication No. 2013/015192 has the dedicated controller dedicated to diagnosing malfunctions as described above, which increases the number of parts, increases the size of the device, and consequently can lead to the problem of increased costs.

For example, in a case of the present inventors applying the same method as the method disclosed in the above International Publication No. 2013/015192 to estimation of the life expectancy of a battery pack, problems the same as those of the above International Publication No. 2013/015192 conceivably may occur.

The present inventors diligently studied whether the life expectancy of a battery pack might be able to be estimated using an existing circuit or the like within the electricity distribution device, instead of attaching a device dedicated to estimation of the life expectancy to the electricity distribution device, in order to estimated (also referred to as calculate) the estimated life expectancy of a battery pack, thereupon have found the following understanding.

The electricity distribution device is provided with a primary power converter circuit (e.g., a DC/AD inverter) to convert DC electric power discharged from the battery pack into electric power to be supplied to the load, for example. Accordingly, the primary power converter circuit is never driven in an unloaded state (state where the load is not connected to the primary power converter circuit). Driving the primary power converter circuit in an unloaded state to estimate the life expectancy of the battery pack is heretofore unknown. The reason is as follows. It has been known in the field of power supply circuits that driving the primary power converter circuit in an unloaded state consumes a small electric power. However, the amount of power consumed when driving the primary power converter circuit in an unloaded state is small, so estimating the life expectancy of the battery pack takes a long amount of time. Accordingly, consuming discharge of the battery pack at the primary power converter circuit in an unloaded state in order to estimate the life expectancy of the battery pack is generally unthinkable.

The above understanding is almost completely unknown in the field of batteries, as well. The battery pack diagnosis method and the device thereof according to the present disclosure belong to the field of batteries, so driving the primary power converter circuit in an unloaded state by the discharge of the battery pack and consuming discharge of the battery pack is almost inconceivable in the field of batteries.

Given the above-described environment, the present inventors actually ventured to drive the primary power converter circuit in an unloaded state using the battery pack mounted to the electricity distribution device, and consume the battery pack. As a result, it was found that the primary power converter circuit consumes two to three times the electric power (e.g., approximately 20 to 30 W) than initially predicted (e.g., less than 10 W).

Based on this understanding, the present inventors conceived estimating the life expectancy of a battery pack using the primary power converter circuit existing within the electricity distribution device, instead of attaching a device dedicated to estimation of the life expectancy to the electricity distribution device, in order to estimated the estimated life expectancy of the battery pack, and thus arrived at the invention according to the aspect described below.

An electricity distribution device according to an aspect of the present disclosure is an electricity distribution device connected to a system power supply and a battery pack. The electricity distribution device includes:

a first connector connected to the battery pack;

a second connector connected to the load;

a primary power converter circuit operative to convert DC electric power discharged from the battery pack into electric power to be supplied to the load;

a first switch operative to switch conducting and non-conducting states between the primary power converter circuit and the load; and a control circuitry operative to control the first switch to switch the conducting and non-conducting states between the primary power converter circuit and the load.

The control circuitry causes the primary power convertor circuit to consume DC electric power discharged from the battery pack, in a state where the first switch switches the non-conducting state between the primary power convertor circuit and the load has been placed using the first switch, and acquires a current value over the time when discharging from the fully-charged state of the battery pack to an empty state, and measures the fully-charged capacity of the battery pack using the acquired current value.

According to the above aspect, the primary power convertor circuit is caused to consume DC electric power discharged from the battery pack in a state where between the primary power convertor circuit and the load is in a non-conducting state. That is to say, the primary power convertor circuit is intentionally driven in an unloaded state (a state where the load is not connected to the primary power convertor circuit). Accordingly, the DC current discharged from the battery pack is converted into electric power to be supplied to the load, thereby creating a state where the primary power convertor circuit consumes the DC electric power.

Accordingly, the primary power convertor circuit is made to consume the DC current discharged from the battery pack, and existing parts are used without providing dedicated equipment to measure the capacity in a fully-charged state of the battery pack (fully-charged capacity), so increase in the number of parts in the electricity distribution device can be prevented. As a result, increase in size and increase in cost of the device can be prevented.

Note that these general or specific aspects may be implemented as a system, a method, an integrated circuit, a computer program, or a recording medium such as a computer-readable CD-ROM or the like, or as any combination of a system, method, integrated circuit, computer program, and recording medium.

The electricity distribution device and diagnosis method according to an example of the present disclosure will be described in detail with reference to the drawings. Note that the embodiments described below are all specific examples of the present disclosure. Values, shapes, materials, components, layout positions and connection forms of components, steps, orders of steps, and so forth in the following embodiments are only exemplary, and are not intended to restrict the present disclosure. Components in the following embodiments which are not included in an independent Claim of the present disclosure indicating the highest concept are described as being optional components.

Embodiment

Configuration of Electricity Distribution Device

Figure 1A:
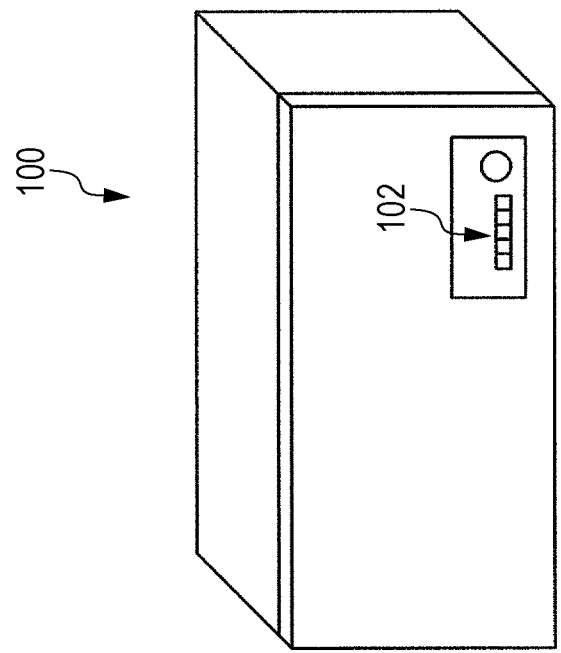

FIGS. 1A and 1B are external perspective views of an electricity distribution device according to an embodiment of the present disclosure. Specifically, FIG. 1A is an external perspective view of a state where a lid 10 of an electricity distribution device 100 is closed in a normal state, and FIG. 1B is an external perspective view of a state where the lid 10 is open at the time of exchanging battery packs 201 through 203.

The electricity distribution device 100 has a lid 10 and a main unit 20, serving as a main unit casing, as illustrated in FIG. 1. The main unit 20 has formed therein a storage portion 30 to store the battery packs 201 through 203.

Electrode terminals of the battery packs 201 through 203 are electrically connected to multiple connectors 131 through 133 serving as connectors in a state of having been accommodated in the storage portion 30 as illustrated in FIG. 1B. A display 102 is provided to the main unit 20, and the lid 10 is provided with an opening 11 for visually confirming the display 102 in a state where the lid 10 is closed as illustrated in FIG. 1A.

Figure 2:
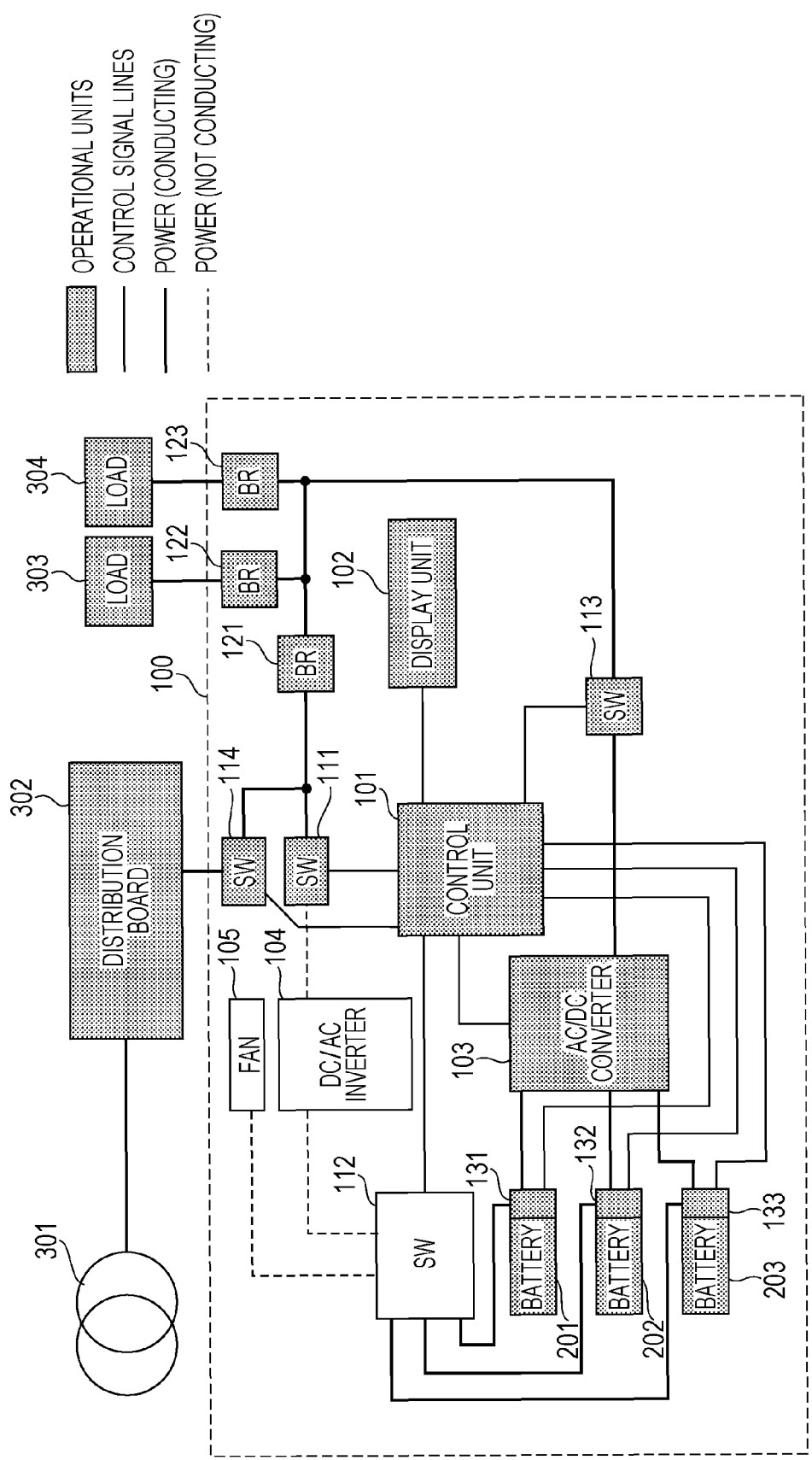
FIG. 2 is a circuit diagram of the electricity distribution device according to an embodiment of the present disclosure, illustrating a state when in normal operation.

FIG. 2 is a circuit diagram of the electricity distribution device according to the embodiment of the present disclosure, illustrating a state when in normal operation. The electricity distribution device 100 is connected to a system power supply 301 via a distribution board 302, and is a device which can supply electric power to various types of loads 303 and 304 from multiple battery packs 201 through 203, which are separate power supplies from the system power supply 301, at the time of self-sustaining operations.

The electricity distribution device 100 includes a control circuitry 101, the display 102, an AC/DC converter (also called a secondary power converter circuit) 103, a DC/AC inverter 104 (also called a primary power converter circuit), a fan 105, various types of switches 111 through 114, various types of circuit breakers 121 through 123, and the multiple connectors 131 through 133.

The control circuitry 101 includes, for example, a central processing unit (CPU) and a storage unit storing a predetermined program, and is realized by the CPU reading and executing the predetermined program. The control circuitry 101 performs switching control of the switches 111 through 114 between conducting and non-conducting, following the predetermined program.

The display 102 is configured including multiple light emitting diodes (LEDs), and performs display indicating the remaining battery level of the battery packs 201 through 203, error displays, and so forth.

The AC/DC converter 103 is an AC/DC converter which converts AC electric power supplied from the system power supply 301 into DC electric power. The multiple battery packs 201 through 203 electrically connected to the respective multiple connectors 131 through 133 are charged by the converted DC electric power.

The DC/AC inverter 104 converts DC electric power discharged from the multiple battery packs 201 through 203 connected to the multiple connectors (also called first connectors) 131 through 133 into AC electric power which is electric power to be supplied to the loads 303 and 304. Note that the DC/AC inverter 104 may have a function to match phases with the AC electric power of the system power supply 301, to supply power of the battery packs 201 through 203 along with the electric power of the system power supply 301.

The fan 105 is a fan for cooling the DC/AC inverter 104. The multiple connectors 131 through 133 are detachably electrically connected to respective electrode terminals of the multiple battery packs 201 through 203. Note that the battery packs 201 through 203 are each multiple electric cells (omitted from illustration) connected serially.

The various types of switches 111 through 114 are made up of a first switch 111, a second switch 112, a third switch 113, and a fourth switch 114. The first switch 111 switches conducting and not conducting states between the DC/AC inverter 104 and the loads 303 and 304. The second switch 112 switches conducting and not conducting states between the multiple connectors 131 through 133 and the DC/AC inverter 104. The third switch 113 switches conducting and not conducting states between the system power supply 301 and the AC/DC converter 103. The fourth switch 114 switches conducting and not conducting states between the system power supply 301 and the loads 303 and 304.

Normal Operation Processing

In a normal state, the electricity distribution device 100 performs normal operations where electric power supply from the system power supply 301 is supplied to the loads 303 and 304 via the distribution board 302, and electric power is supplied to the multiple connectors 131 through 133 via the AC/DC converter 103, thereby charging the multiple battery packs 201 through 203, as illustrated in FIG. 2.

That is to say, during normal operations, the control circuitry 101 switches the various types of switches 111 through 114 as follows. The control circuitry 101 switches the first switch 111 so that the DC/AC inverter 104 and the loads 303 and 304 are in a non-conducting state. The control circuitry 101 also switches the second switch 112 so that the multiple connectors 131 through 133 and the DC/AC inverter 104 are in a non-conducting state. The control circuitry 101 also switches the third switch 113 so that the system power supply 301 and the AC/DC converter 103 are in a conducting state. The control circuitry 101 also switches the fourth switch 114 so that the system power supply 301 and the loads 303 and 304 are in a conducting state.

In a case where the system power supply 301 and the loads 303 and 304 are electrically connected, normally, the resolution ratio are connected to the system power supply 301 via electrical terminals (also called second connectors) disposed in the electricity distribution device. For example, in a case where the loads are connected via breakers (122 and 123), the wiring connected to the system power supply 301 is connected to one of the electric terminals of the breakers. The second connectors, which are the other electric terminals on the opposite side from the electric terminals, are connected to the loads. Alternatively, the second connector may be an electrical power outlet disposed in the electricity distribution device. Further, the second connectors may be electric terminals whereby the system power supply 301 and the loads 303 and 304 are electrically connected, not restricted to the above forms.

Self-Sustaining Operation Processing

Figure 3:
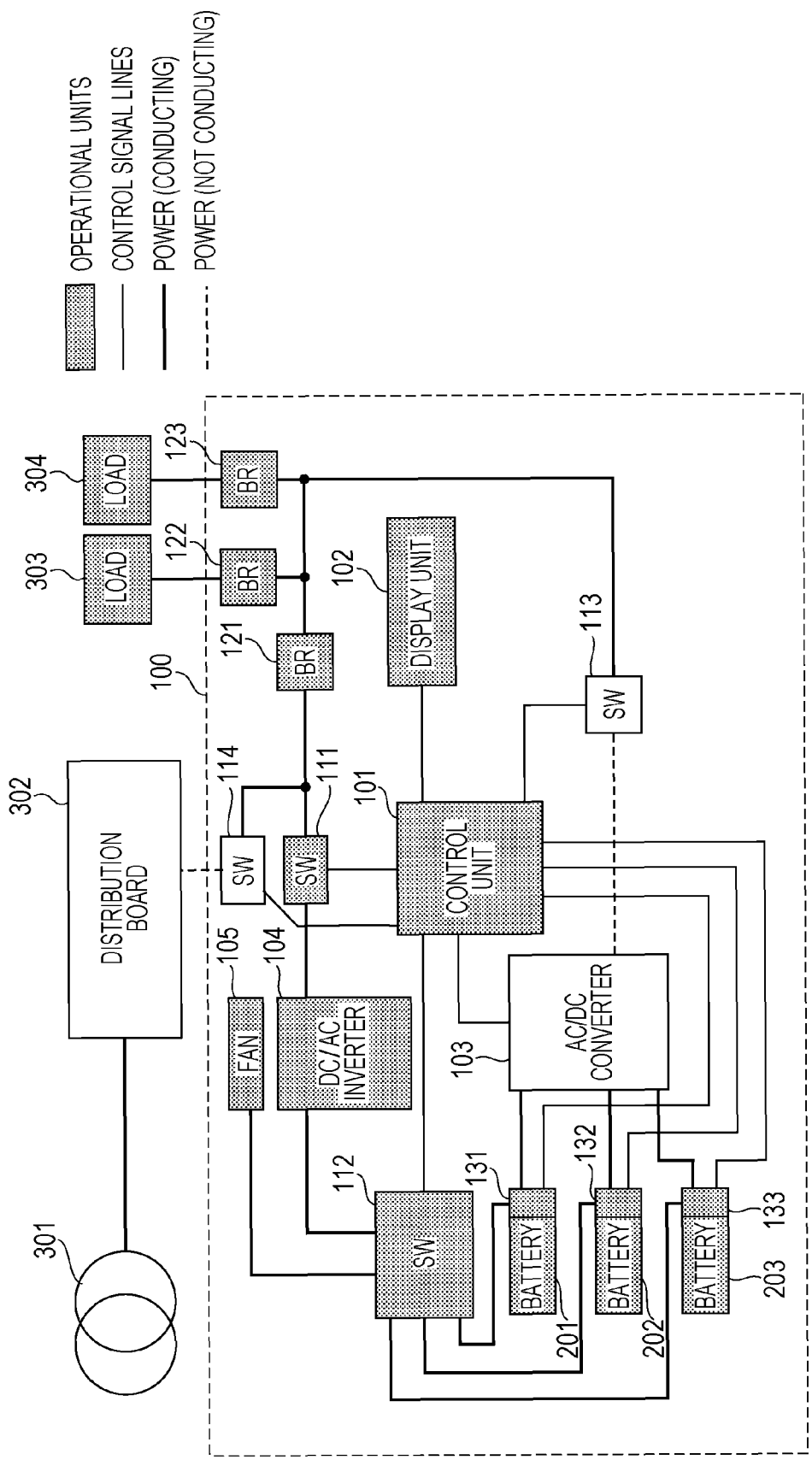

FIG. 3 is a circuit diagram of the electricity distribution device when performing self-sustaining operations where electric power is supplied from multiple battery packs to a load in an emergency such as a power outage or the like.

The electricity distribution device 100 has severed connection to the system power supply 301, and thereupon is performing self-sustaining operations where electric power from the multiple battery packs 201 through 203 is supplied to the loads 303 and 304 via the DC/AC inverter 104, as illustrated in FIG. 3. Accordingly, even in a case where no electric power is being supplied from the system power supply 301, such as during a power outage or the light, the electric power from the multiple battery packs 201 through 203 can be supplied to the loads 303 and 304.

The control circuitry 101 switches the various types of switches 111 through 114 during self-sustaining operations as follows. The control circuitry 101 switches the first switch 111 to place the DC/AC inverter 104 and the loads 303 and 304 in a conducting state. The control circuitry 101 also switches the second switch 112 to place the multiple connectors 131 through 133 in a conducting state with the DC/AC inverter 104. The control circuitry 101 also switches the third switch 113 to place the system power supply 301 and the AC/DC converter 103 in a non-conducting state. The control circuitry 101 also switches the fourth switch 114 to place the system power supply 301 and the loads 303 and 304 in a non-conducting state.

Diagnosis Processing

In the electricity distribution device 100, the control circuitry 101 performs control of switching the various types of switches 111 through 114, and performs diagnosis processing to measure the current fully-charged capacity of the multiple battery packs 201 through 203.

Figure 4:
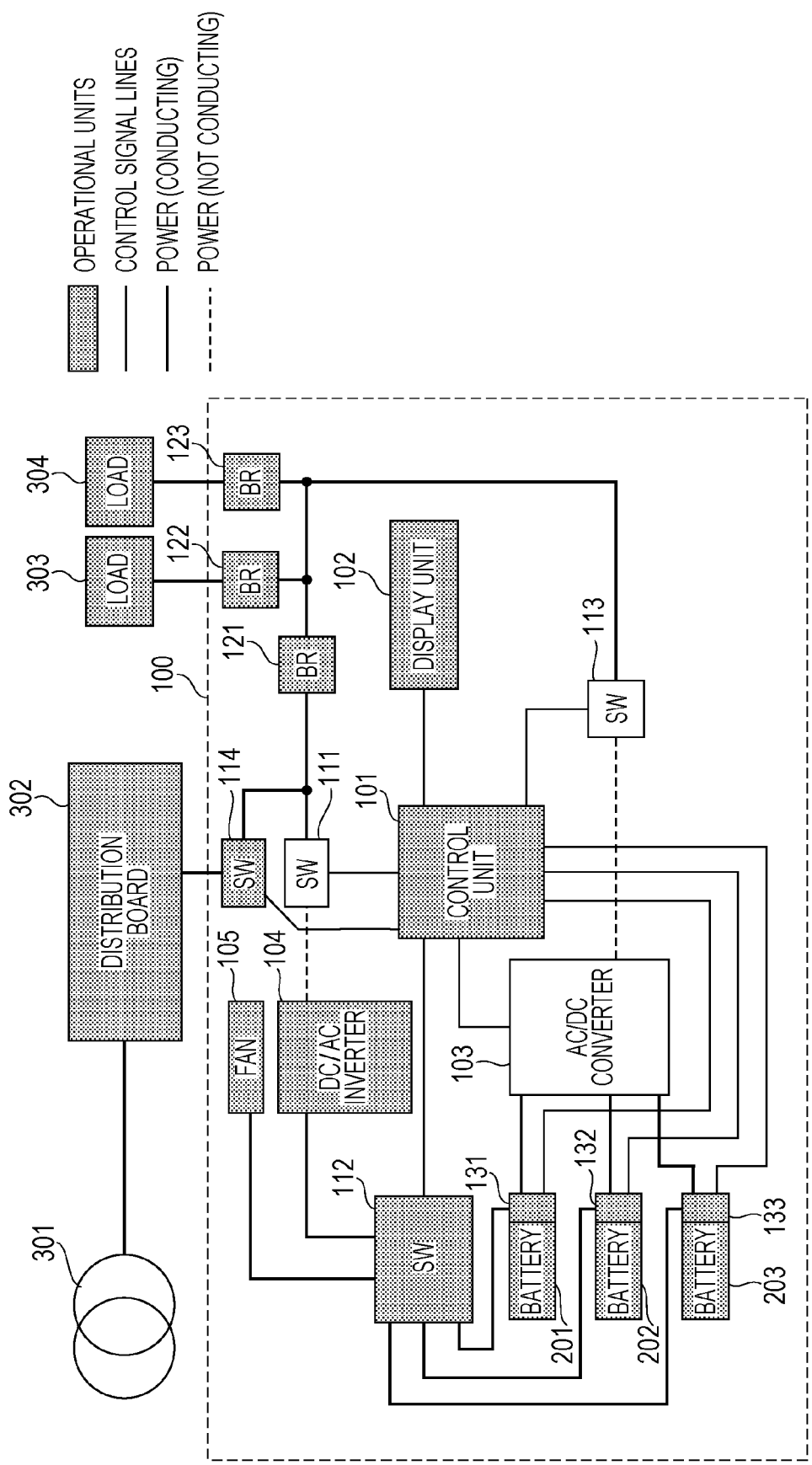
FIG. 4 is a circuit diagram of the electricity distribution device when performing diagnosis processing.

FIG. 4 is a circuit diagram of the electricity distribution device when performing diagnosis processing. The electricity distribution device 100 supplies the electric power of the system power supply 301 to the loads 303 and 304 via the distribution board 302, and also discharges the electric power stored in the multiple battery packs 201 through 203 to the DC/AC inverter 104, as illustrated in FIG. 4. At this time, the electricity distribution device 100 keeps the electric power from the system power supply 301 from being supplied to the AC/DC converter 103, and also keeps the electric power from the multiple battery packs 201 through 203 from being supplied to the loads 303 and 304.

That is to say, the control circuitry 101 switches the various types of switches 111 through 114 as follows when performing diagnosis processing. The control circuitry 101 switches the first switch 111 so that the DC/AC inverter 104 and the loads 303 and 304 are in a non-conducting state. The control circuitry 101 also switches the second switch 112 so that the multiple connectors 131 through 133 and DC/AC inverter 104 are in a conducting state. The control circuitry 101 also switches the third switch 113 so that the system power supply 301 and the AC/DC converter 103 are in a non-conducting state. The control circuitry 101 switches the fourth switch 114 so that the system power supply 301 and the loads 303 and 304 are in a conducting state.

FIG. 5 is a flowchart illustrating an example of the electricity distribution device performing diagnosis processing of a battery pack. First, the control circuitry 101 repeatedly performs processing for measuring the fully-charged capacity of the battery packs (S502 through S504), repeatedly for each of the multiple battery packs 201 through 203 (loop: S501 through S505). The control circuitry 101 controls each of the first switch 111 to a non-conducting state, the second switch 112 to a conducting state, the third switch 113 to a non-conducting state, and the fourth switch 114 to a conducting state (S502). At this time, specifically, the second switch 112 places between one of the multiple battery packs 201 through 203 (e.g., the battery pack 201) and the DC/AC inverter 104 in a conducting state. Note that in a case where the diagnosis processing of the battery pack 201 has already ended, the control circuitry 101 switches the second switch 112 to place between a battery pack which has not yet been subjected to diagnosis processing (e.g., the battery pack 202) and the DC/AC inverter 104 in a conducting state.

Next, the control circuitry 101 acquires the discharge amount in a case of discharging the battery pack placed in a conducting state with the DC/AC inverter 104 in step S502 to the DC/AC inverter 104, out of the multiple battery packs 201 through 203 (S503). Specifically, the current values when being discharged from a fully-charged state to an empty state may be measured as the discharge value of the battery pack (coulomb counting) for each of the multiple battery packs 201 through 203, and information indicating the change of the current values measured over time by the control circuitry 101 being transmitted.

While the control circuitry 101 measures change of the current values measured over time at the time of the battery packs discharging, this is not restrictive, and the discharge amount may be acquired by the control circuitry 101 directly measuring the change of the current values over time at the time of the battery packs discharging.

Next, the control circuitry 101 calculates the discharge amount of the battery pack acquired in step S503 as the current fully-charged capacity of the battery pack, by integrating the current values of the battery pack at the time of discharging from the fully-charged capacity state to an empty state (S504).

Note that measuring the change over time of the current values of the battery pack at the time of the battery pack discharging from the fully-charged capacity state to the empty state is used to calculate the current fully-charged capacity of the battery pack, but the change over time of the current values to be measured does not have to be from the fully-charged capacity state to the empty state.

FIG. 15 is a circuit diagram of the electricity distribution device when performing diagnosis processing, in which FIG. 4 has been simplified. While three battery packs are illustrated in FIG. 4, this is simplified to one battery pack in FIG. 15. As a result, there is no need to change the electric connection between the three battery packs and the DC/AC inverter 104, so the second switch 112 can be omitted. Also, the fourth switch 114 is not related in particular to the diagnosis processing, so the fourth switch 114 is omitted.

The diagnosis operations in FIG. 15 will be described. When performing diagnosis of a battery pack 201, the control circuitry 101 controls the first switch 111 to a non-conducting state. Thus, the electric power of the system power supply 301 is kept from entering the primary power convertor circuit (DC/AC inverter) 104. That is to say, the primary power convertor circuit 104 is in an unloaded state. The primary power convertor circuit 104 then converts the DC electric power discharged from the battery pack 201 (e.g., 24 V) into AC electric power (e.g., 100 V, 50 Hz or 60 Hz), thereby gradually consuming the DC electric power discharged from the battery pack 201. Alternatively, the primary power convertor circuit 104 converts the DC electric power discharged from the battery pack 201 (e.g., 24 V) into a DC electric power (voltage different from that of the DC voltage being discharged, e.g., 5 V), thereby gradually consuming the DC electric power being discharged from the battery pack 201. Accordingly, the electricity distribution device 100 can discharge the battery pack 201 from a fully-charged state to an empty state without having dedicated life span estimating equipment built into the electricity distribution device. The control circuitry 101 then acquires the change over time of the current values from the fully-charged state being discharged to the empty state, from the battery pack 201, integrates the current values, and thus measures the fully-charged capacity.

The reason why the primary power convertor circuit 104 consumes electric power even when unloaded will be described. In a case where the primary power convertor circuit 104 is converting from DC electric power into AC electric power in an unloaded state, the primary power convertor circuit 104 is standing by so as to be able to output AC output to a load as soon as the load is connected. Accordingly, the primary power convertor circuit 104 is consuming electric power.

Also, the higher the frequency of the AC current which the primary power convertor circuit 104 converts is, the greater the power consumption is. Accordingly, the frequency of the AC electric power is preferably converted to a higher frequency when performing diagnosis processing as compared to the frequency when performing self-sustaining operations (e.g., 50 Hz or 60 Hz).

The fan 105 in FIG. 4 can also be driven concurrently, which is preferably since the DC electric power discharged from the battery pack 201 can be consumed even further.

While the current values when discharging were acquired from the battery pack 201 in the above aspect, the current values may be acquired from the primary power convertor circuit 104. Alternatively, a current sensor or the like may be disposed on wiring from the battery pack 201 to the primary power convertor circuit 104, and the control circuitry 101 acquire the above current values.

FIG. 6 is a graph representing the relationship between voltage and state of charge (SOC) when a battery pack is discharged from a fully-charged state to an empty state. As the amount of discharge by discharge from the fully-charged state of the battery pack increases, transition is made from a high-SOC region R11 where voltage rapidly drops to a mid-SOC region R12 where voltage drops less rapidly than the high-SOC region R11, as illustrated in FIG. 6. In a case where the amount of discharge further increases, transition is made from the mid-SOC R12 region to a low-SOC R13 region where the voltage drops more rapidly than the mid-SOC R12 region. If the amount of discharge when the output voltage of the battery pack is measured can be identified, the relative capacity, which is the rate of charge capacity at that time as to the fully-charged capacity according to the deterioration state of the battery pack at that time, can be identified. That is to say, the inclination of change in voltage as to the change in the discharge amount is great in the high-SOC region R11 and the low-SOC region R13 in a battery pack having such properties, so the relative capacity can be identified with relatively good precision as compared to a case of measuring in the mid-SOC region R12 by measuring the output voltage of the battery pack.

That is to say, acquiring the amount of discharge when discharging from the battery pack to the DC/AC inverter 104 from a predetermined SOC in the high-SOC region R11 to a predetermined SOC in the low-SOC region R13 enables the current fully-charged capacity of this battery pack to be identified.

Note that steps S502 through S504 are performed by the multiple battery packs 201 through 203 all begin selected in order one at a time. Thus, the control circuitry 101 acquires the amount of discharge for each of the multiple battery packs 201 through 203, when having discharged from the relevant battery pack to the DC/AC inverter 104 one at a time, thereby measuring the fully-charged capacity of the multiple battery packs 201 through 203. That is to say, the control circuitry 101 rotates the multiple battery packs 201 through 203 one at a time to discharge to the DC/AC inverter 104, and measure the fully-charged capacity of each of the multiple battery packs 201 through 203. Thus, since diagnosis processing is not performed on all of the multiple battery packs 201 through 203 serving as the backup power supply at once, even if a power outage occurs during the diagnosis processing, the electric power of at least two battery packs can be supplied to the loads 303 and 304. Accordingly, measurement of the fully-charged capacity of the battery packs can be performed in a sure manner by discharging around 90% of the power charged to the battery packs, while also securing a minimal amount of electric power to be supplied to the loads 303 and 304 in an emergency (power outage).

While the fully-charged capacity of the battery packs was calculated in the description above by acquiring the amount of discharge when discharging the battery packs from fully-charged or a predetermined SOC region of the high-SOC region, the fully-charged capacity of the battery packs may be calculated by acquiring the amount of discharge when charging the battery packs from an empty state or a predetermined SOC region of the low-SOC region.

FIG. 7 is a flowchart illustrating another example of the electricity distribution device performing diagnosis processing of a battery pack. In this case, the control circuitry 101 repeatedly performs processing for measuring the fully-charged capacity of the battery packs (S702 through S706), repeatedly for each of the multiple battery packs 201 through 203 (loop: S701 through S707). The control circuitry 101 controls each of the first switch 111 to a non-conducting state, the second switch 112 to a conducting state, the third switch 113 to a non-conducting state, and the fourth switch 114 to a conducting state (S702). Specifically, this is the same processing as in step S502, so description will be omitted.

Next, the control circuitry 101 discharges the battery pack, out of the multiple battery packs 201 through 203 placed in a conductive state with the DC/AC inverter 104 in step S701, to the DC/AC inverter 104 until in an empty state (S703).

Next, the control circuitry 101 controls each of the first switch 111 to a conducting state, the second switch 112 to a non-conducting state, the third switch 113 to a conducting state, and the fourth switch 114 to a conducting state (S704).

Next, the control circuitry 101 charges from the AC/DC converter 103 to the battery pack, and acquires the charge amount when performing this charging (S705).

The control circuitry 101 then calculates the acquired charge amount of the battery pack as the current fully-charged capacity of the battery pack, by integrating the current values of the battery pack at the time of discharging from the empty state to the fully-charged capacity (S706).

At this time, the change of current values of the battery pack over time are measured when charging from the empty state to the fully-charged state, in the diagnosis processing when charging in the same way as the diagnosis processing when discharging, thereby calculating the current fully-charged capacity of the battery pack, but the change over-time of the current values to be measured does not have to be from the empty state to the fully-charged capacity.

Figure 8:
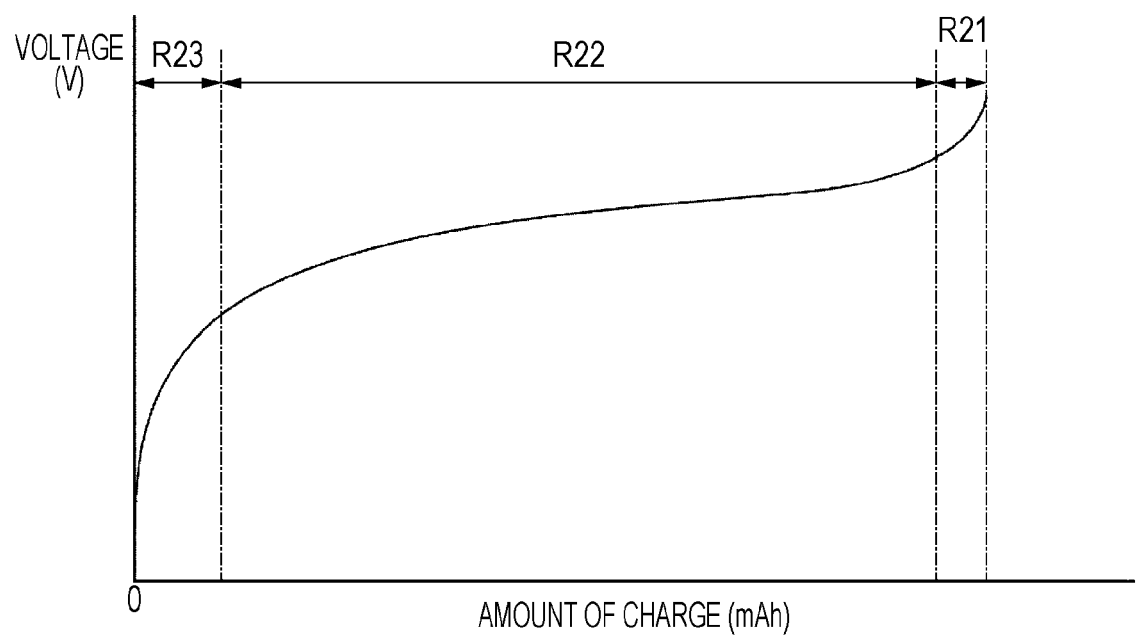
FIG. 8 is a graph representing the relationship between voltage and SOC when a battery pack is charged from an empty state to a fully-charged state.

FIG. 8 is a graph representing the relationship between voltage and SOC when a battery pack is charged from an empty state to a fully-charged state. Opposite to FIG. 6, as the amount of charge by charging from the empty state of the battery pack increases, transition is made from a low-SOC region R23 where voltage rapidly rises to a mid-SOC region R22 where voltage rises less rapidly than the low-SOC region R23, as illustrated in FIG. 8. In a case where the amount of charge further increases, transition is made from the mid-SOC region R22 to a high-SOC region R21 where the voltage rises more rapidly than the mid-SOC region R22. If the amount of charge when the output voltage of the battery pack is measured can be identified, the relative capacity can be identified. That is to say, the inclination of change in voltage as to the change in the charge amount is great in the low-SOC region R23 and the high-SOC region R21 in a battery pack having such properties, so the relative capacity can be identified with relatively good precision as compared to a case of measuring in the mid-SOC region R22, by measuring the output voltage of the battery pack.

Figure 9:
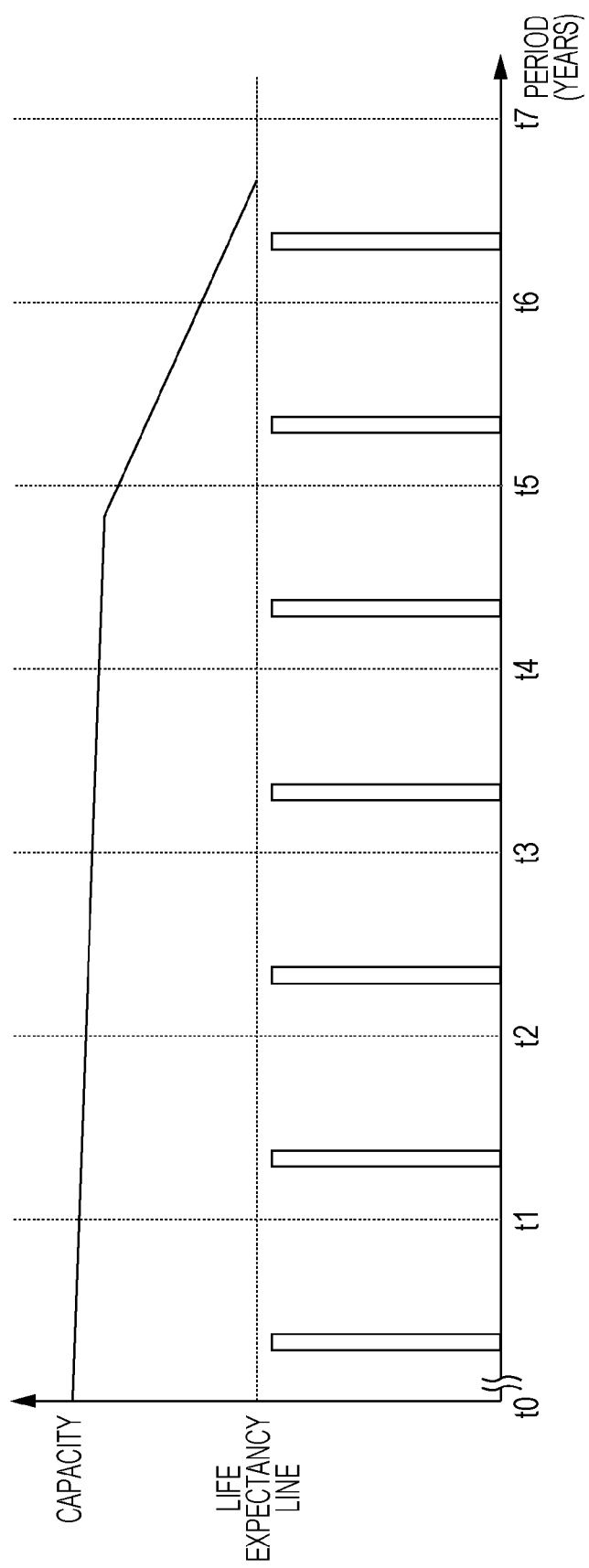
FIG. 9 is a diagram for describing an example of timing for performing diagnosis processing.

That is to say, by acquiring the amount of charge when charging a battery pack from a predetermined SOC in the low-SOC region R23 to a predetermined SOC in the high-SOC region R21, the current fully-charged capacity of this battery pack can be identified. The properties illustrated in FIG. 8 are the properties of a nickel-hydride cell. This is the same in a case of a lithium ion battery as well. Timing for Performing Diagnosis Processing Timing for performing the diagnosis processing will be described with reference to FIGS. 9 through 12. FIG. 9 is a diagram for describing an example of timing for performing diagnosis processing. In FIG. 9, the vertical axis illustrates the fully-charged capacity of the battery pack, and the horizontal axis illustrates the period. Each of t1 through t7 on the horizontal axis represents a period of one-year intervals, for example, so the period from t1 to t2 is one year. Also, the line graph illustrates the fully-charged capacity of the battery pack measured by diagnosis processing. The bar graph indicates the timings at which the diagnosis processing is performed. Note that these bar graphs only indicate the timings at which the diagnosis processing is performed, and there is no meaning in the height thereof.

In the example illustrated in FIG. 9, the diagnosis processing is performed at predetermined intervals (e.g., yearly) regardless of the change in the fully-charged capacity of the battery pack.

Figure 10:
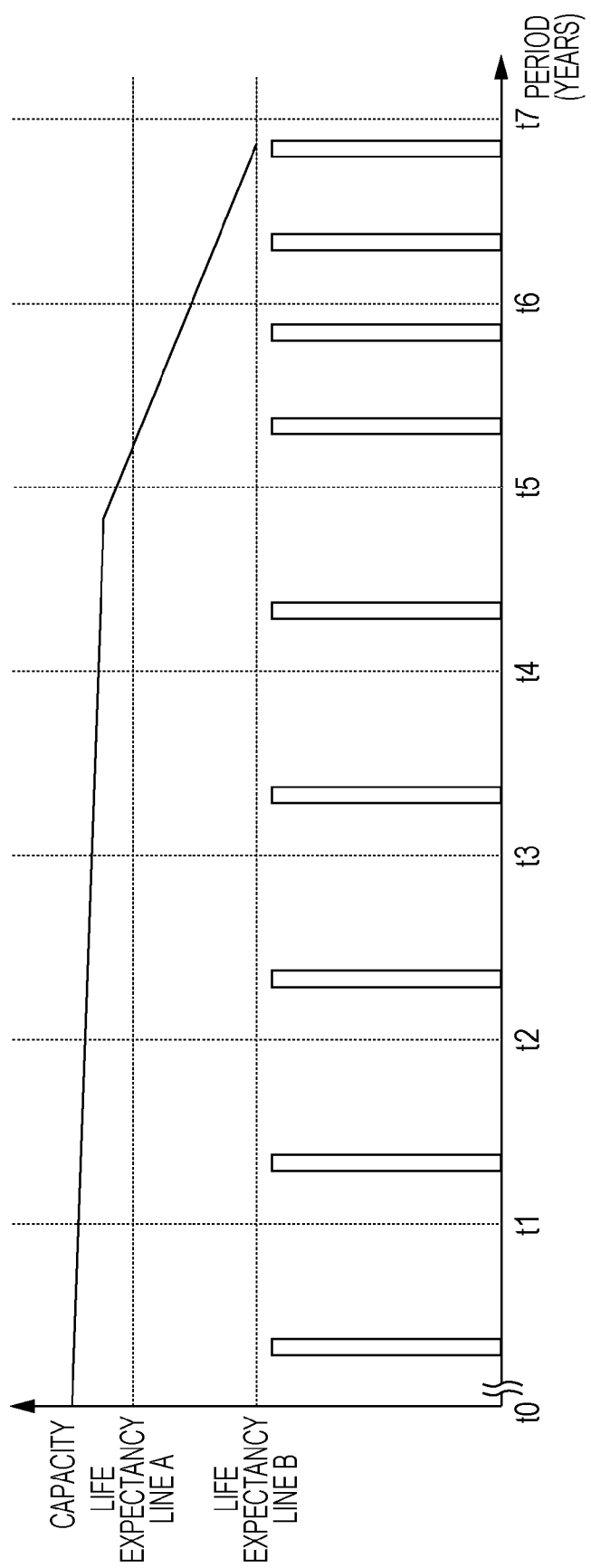
FIG. 10 is a diagram for describing another example of timing for performing diagnosis processing.

FIG. 10 is a diagram for describing another example of timing for performing diagnosis processing. In FIG. 10, the vertical axis, horizontal axis, line graph, and bar graph, are the same as in FIG. 9, so description will be omitted. The example illustrated in FIG. 10 is an example where the frequency of the diagnosis processing is raised to twice, for example, in a period after the line graph has fallen to or below a life expectancy line A, which is a predetermined value (e.g., in period t5 to t6 and period t6 to t7). The fully-charged capacity of the battery pack rapidly drops from a certain period on, as shown in the line graph. Accordingly, increasing the frequency of diagnosis processing when the fully-charged capacity reaches the life expectancy line A, for example, enables detecting the fully-charged capacity reaching a predetermined life expectancy line B at a precise timing.

The example illustrated in FIG. 10 may be an example where the frequency of the diagnosis processing is raised to twice, for example, in a period after the inclination of the line graph has progressed to a predetermined inclination or more (e.g., in period t5 to t6 and period t6 to t7). Accordingly, increasing the frequency of diagnosis processing when the inclination of the line graph has progressed to a predetermined inclination or more, for example, enables detecting the fully-charged capacity reaching a predetermined life expectancy line B at a precise timing.

Figure 11:
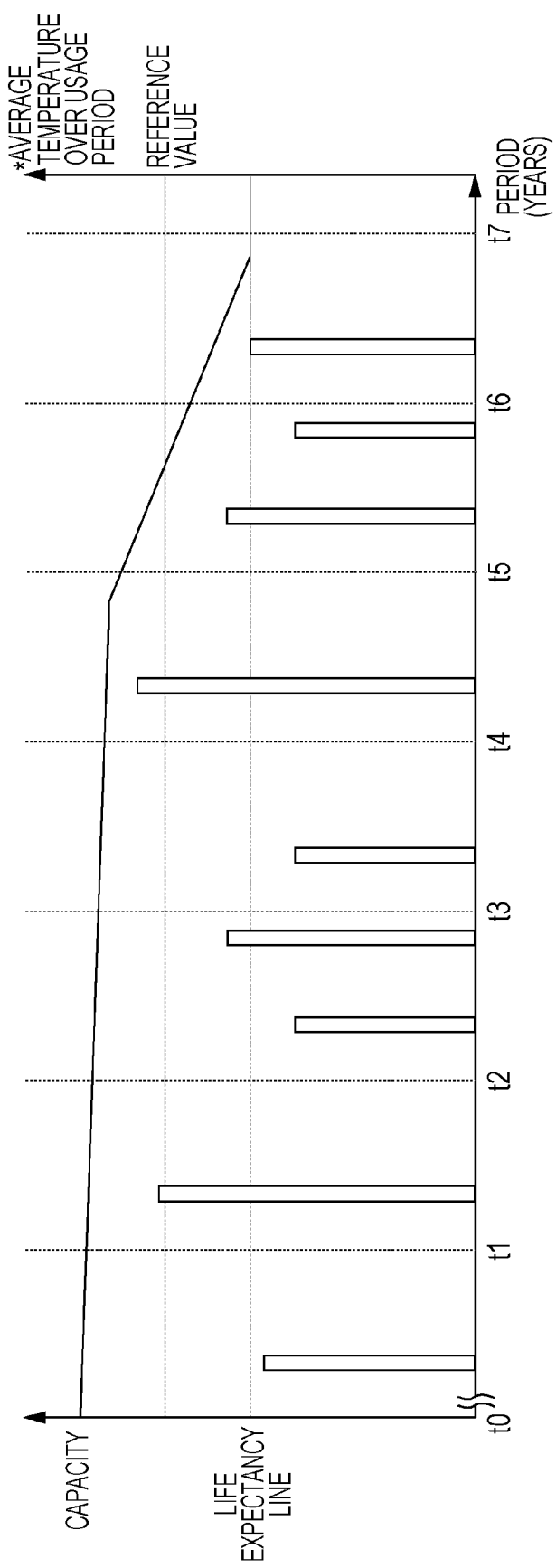
FIG. 11 is a diagram for describing another example of timing for performing diagnosis processing.

FIG. 11 is a diagram for describing another example of timing for performing diagnosis processing. In FIG. 11, the vertical axis on the left side represents the fully-charged capacity of the battery pack, the vertical axis on the right side represents the product of the average temperature and usage period, and the horizontal axis represents the period. The line graph is the same as in FIGS. 9 and 10, and is correlated with the vertical axis to the left side. The bar graphs represent the timing at which the diagnosis processing is performed. The height of the bar graphs further are correlated with the vertical axis at the right side, indicating the product of the average temperature and usage period of the battery pack up to the timing at which the diagnosis processing is performed.

In the example illustrated in FIG. 11, in a case where the product of the average temperature and usage period of the battery pack up to the timing at which the diagnosis processing is performed reaches a predetermined capacity or more, the frequency of the diagnosis processing in periods after this timing is increased to twice in this example. The life expectancy of a battery pack is easily affected by the product of the average temperature and usage period, so by raising the frequency of the diagnosis processing in periods after this timing is increased enables detecting the state of the battery pack immediately after conditions under which the life expectancy readily deteriorates, in a precise manner.

Figure 12:
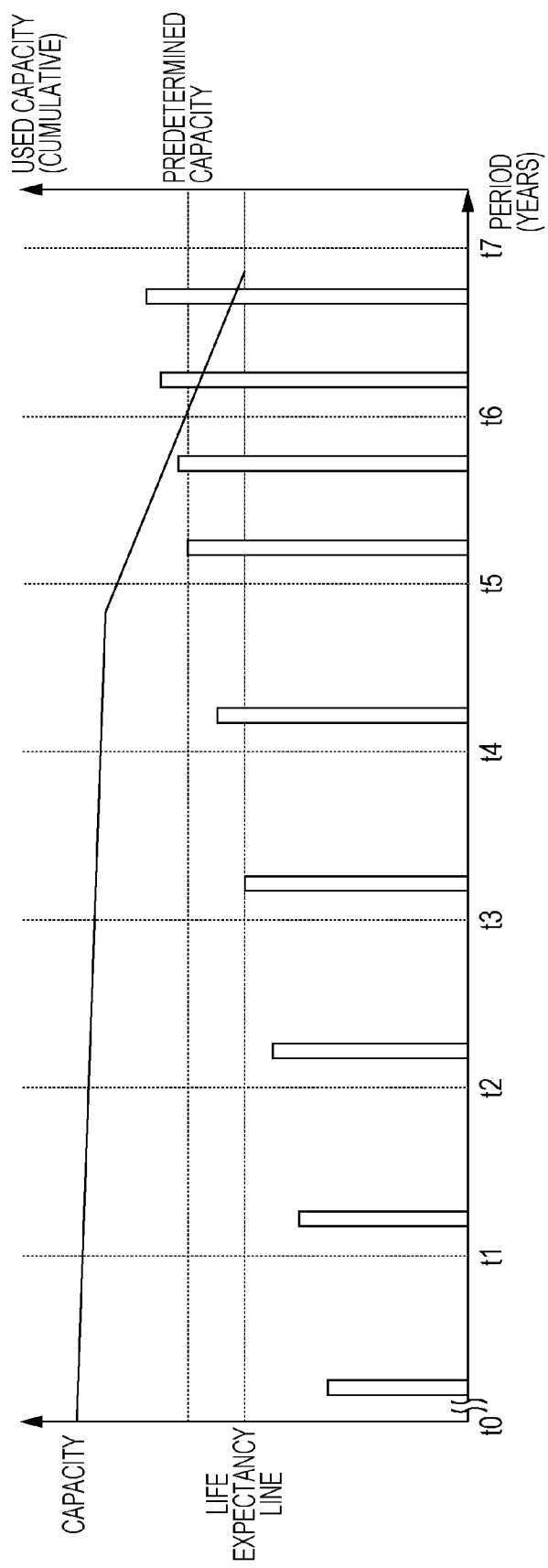
FIG. 12 is a diagram for describing another example of timing for performing diagnosis processing.

FIG. 12 is a diagram for describing another example of timing for performing diagnosis processing. In FIG. 12, the vertical axis on the left side represents the fully-charged capacity of the battery pack, the vertical axis on the right side represents the cumulative usage capacity of the battery pack, and the horizontal axis represents the period. The line graph is the same as in FIGS. 9 through 11, and is correlated with the vertical axis to the left side. The bar graphs represent the timing at which the diagnosis processing is performed. The height of the bar graphs further are correlated with the vertical axis at the right side, indicating the cumulative capacity of use of the battery pack up to the timing at which the diagnosis processing is performed.

In the example illustrated in FIG. 12, in a case where the cumulative capacity of use of the battery pack up to the timing at which the diagnosis processing is performed reaches a predetermined capacity or more, the frequency of the diagnosis processing in periods after this timing is increased to twice in this example. The life expectancy of a battery pack is easily affected by the cumulative capacity of use, so in a case where the cumulative capacity reaches a predetermined capacity or more, raising the frequency of the diagnosis processing in periods after this timing enables detecting the fully-charged capacity reaching a predetermined life expectancy line at a precise timing.

As described in FIGS. 9 through 12, the timing of the diagnosis processing is decided on an optional timing based on information which the control circuitry 101 of the electricity distribution device 100 has obtained from various parts within the electricity distribution device 100.

Figure 13:
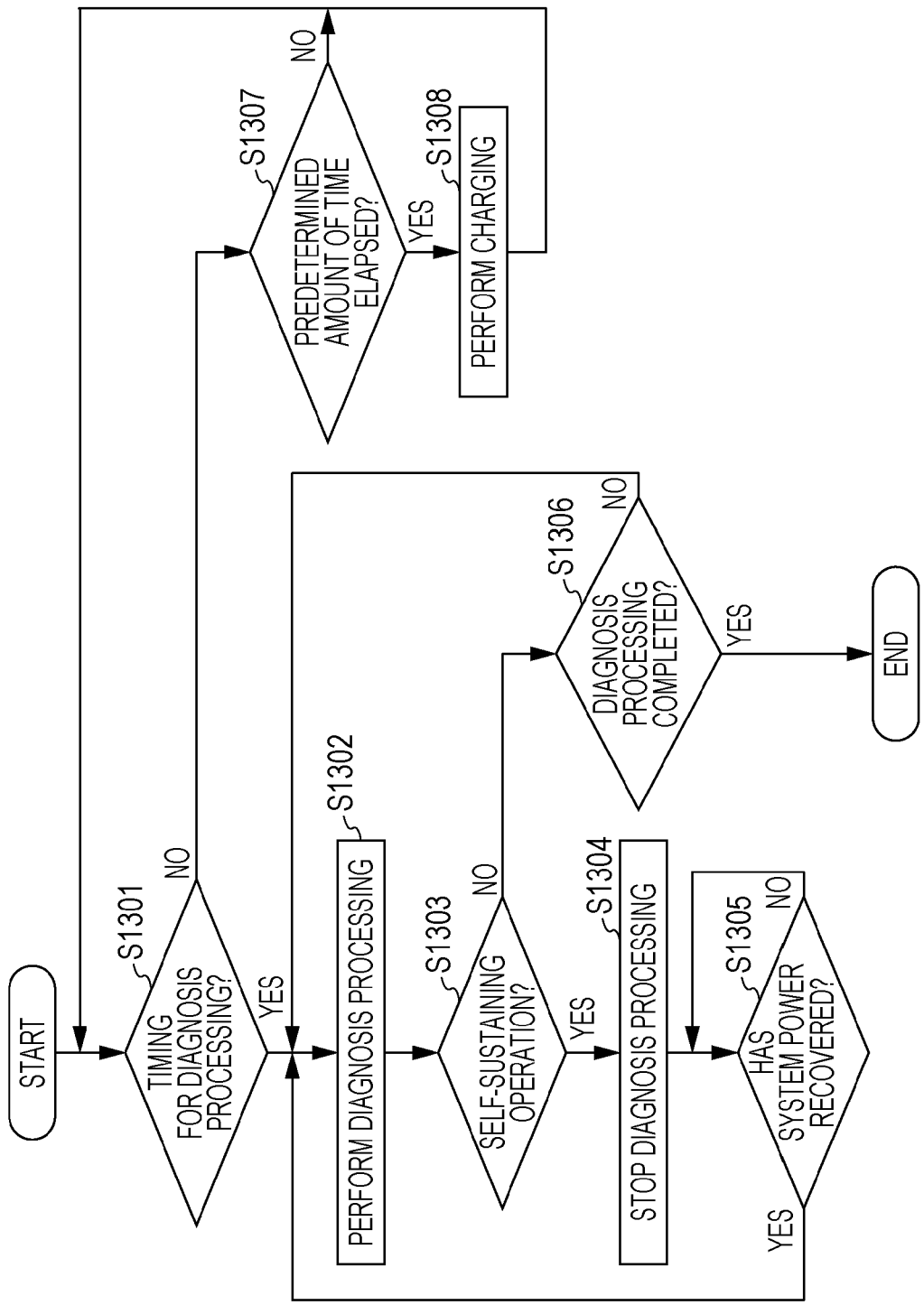
FIG. 13 is a flowchart for describing a processing flow of the electricity distribution device.

FIG. 13 is a flowchart for describing a processing flow of the electricity distribution device. The control circuitry 101 of the electricity distribution device 100 first determines whether or not a diagnosis processing timing has arrived, based on one of the logics described in FIGS. 9 through 12, as illustrated in FIG. 13 (S1301).

Next, if determination is made that a diagnosis processing timing has arrived (Yes in S1301), the control circuitry 101 performs the diagnosis processing described in FIG. 5 (S1302).

Next, the control circuitry 101 determines whether or not self-sustaining operations have been started while performing diagnosis processing (S1303).

In a case where determination is made that self-sustaining operations have been started (Yes in S1303, the diagnosis processing is stopped (S1304).

Next, the control circuitry 101 determines whether or not the system power supply 301 has recovered (S1305).

In a case where the system power supply 301 has recovered (Yes in S1305), the control circuitry 101 returns to step S1302. On the other hand, in a case where the system power supply 301 has not recovered (No in S1305), step S1305 is repeated.

In a case where determination is made in step S1303 that self-sustaining operations have not been started (No in S1303), the control circuitry 101 continues diagnosis processing, and determines whether or not diagnosis processing has been completed (S1306). In a case where determination is made that the diagnosis processing has been competed (Yes in S1306) the control circuitry 101 ends this processing, and in a case where determination is made that the diagnosis processing is not completed (No in S1306), returns to step S1302 and continues diagnosis processing.

In step S1301, in a case where the control circuitry 101 determines that the timing for diagnosis processing has not arrived (No in S1301), determination is made whether a predetermined period has elapsed from the newest timing where the multiple battery packs 201 through 203 have been charged to a fully-charged state (S1307).

In a case where determination is made that the predetermined period has elapsed (Yes in S1307), the multiple battery packs 201 through 203 are charged until a fully-charged capacity (S1308). That is to say, the electricity distribution device 100 is placed in a charging state under normal operations. Thus, the multiple battery packs 201 through 203 are charged each time the predetermined period elapses, so the multiple battery packs 201 through 203 are maintained in a fully-charged state or a state near the fully-charged state. In a case whether determination is made that the predetermined period has not elapsed (No in S1307), the flow returns to step S1301.

According to the electricity distribution device 100 of the present embodiment, the fully-charged capacity of the multiple battery packs 201 through 203 can be measured using the DC/AC inverter 104. Accordingly, determination can be made regarding whether the fully-charged capacity of the multiple battery packs 201 through 203 is sufficient, without providing dedicated equipment to measure the fully-charged capacity of the multiple battery packs 201 through 203.

According to the electricity distribution device 100 of the present embodiment, the discharge amount is acquired for discharging to the DC/AC inverter 104 from the high-SOC region R11 to the low-SOC region R13 for each of the multiple battery packs 201 through 203, whereby the fully-charged capacity of the battery packs can be measured, so the fully-charged capacity of the battery packs can be comprehended more accurately.

According to the electricity distribution device 100 of the present embodiment, the first switch 111 and the third switch 113 are switched to a non-conducting state at the time of performing diagnosis processing, and the second switch 112 and fourth switch 114 are switched to a conducting state, so the circuit where diagnosis processing is being performed by discharging the battery packs, and the circuit from the system power supply 301 to the loads 303 and 304 can be isolated. Thus, being charged from the system power supply 301 during discharge of the battery packs for diagnosis processing, and supply of the electric power being supplied from the battery packs to the loads 303 and 304, can be prevented.

According to the electricity distribution device 100 of the present embodiment, the multiple battery packs 201 through 203 are detachably connected to the multiple connectors 131 through 133, so at leas tone of the multiple battery packs 201 through 203 can be detached and used in another device. Also, a battery pack of the multiple battery packs 201 through 203 regarding which determination is made that the fully-charged capacity is insufficient, or a battery pack which has malfunctioned, can be easily replaced.

According to the electricity distribution device 100 of the present embodiment, information indicating a battery pack of a battery pack regarding which determination has been made that the fully-charged capacity is insufficient is displayed on the display 102, so battery packs needing replacement can be easily determined.

Modifications

First Modification

The control circuitry 101 may further measure the load current value when supplying the electric power of the multiple battery packs 201 through 203 to the loads 303 and 304, and diagnose whether or not the fan 105 has an abnormality. More specifically, the control circuitry 101 diagnoses whether or not an abnormality is occurring at the fan 105 by determining whether or not the load current value within a predetermined current value range. Accordingly, whether or not an abnormality has occurred at the fan 105 can be easily diagnosed without providing diagnosis equipment for the fan 105.

Second Modification

The electricity distribution device 100 according to the above-described embodiment may further measure values regarding charging when the multiple battery packs 201 through 203 are charged from an empty state to a fully-charged state, and diagnose whether or not there is an abnormality at the AC/DC converter 103. More specifically, the control circuitry 101 measures at least one of charging time, charging voltage, and charging current, as a value relating to charging, and determines whether or not the values are within a predetermined value range, thereby determining whether or not there is an abnormality at the AC/DC converter 103. Accordingly, whether or not there an abnormality has occurred at the AC/DC converter 103 can be easily determined without providing equipment for diagnosing the AC/DC converter 103.

Third Modification

While the electricity distribution device 100 according to the above-described embodiment has been described as the control circuitry 101 deciding the timing for diagnosis processing based on information obtained from parts within the electricity distribution device 100, this is not restrictive. For example, the electricity distribution device 100 may have a receiver capable of receiving external information, and in this case, the control circuitry 101 may measure the fully-charged state of the multiple battery packs 201 through 203 at any timing based on the information which the receiver receives. Specifically, a period where there is little chance of power outage may be externally received, and measurement performed in this period. Also, power outage plans and power outage information may be externally received, and measurement be performed before this period.

Fourth Modification

While the electricity distribution device 100 according to the above-described embodiment has been described having a configuration where the multiple battery packs 201 through 203 are connected to the multiple connectors 131 through 133, the number of battery packs does not have to be multiple, and may be singular. The advantage of being able to perform diagnosis processing of the battery pack without having a dedicated device can be had in this case as well.

Fifth Modification

While the electricity distribution device 100 according to the above-described embodiment has been described using the DC/AC inverter 104 as the primary power convertor circuit, this is not restrictive as long as the load handles DC electric power, and this may be a DC/DC converter instead.

Sixth Modification

While the electricity distribution device 100 according to the above-described embodiment has been described with the first switch 111 and fourth switch 114 existing independently, this is not restrictive, and one switch may be used which switches the switching destination of the load to either one of the primary power convertor circuit and the system power supply, as illustrated in FIG. 15. In this case, this integrated switch may be called the first switch. The control circuitry 101 controls the first switch to connect between the system power supply 301 and loads 303 and 304 during normal operations. Also, the control circuitry 101 effects control so that between the primary power convertor circuit 104 and the loads 303 and 304 are in a conducting state in an emergency.

Seventh Modification

While the electricity distribution device 100 according to the above-described embodiment has been described with the control circuitry 101 controlling the first switch 111 to a non-conducting state, the second switch 112 to a conducting state, the third switch 113 to a non-conducting state, and the fourth switch 114 to a conducting state, in step S502 during diagnosis processing, this is not restrictive. Specifically, the control circuitry 101 does not have to place the third switch 113 in a non-conducting state and the fourth switch 114 in a conducting state in the diagnosis processing. That is to say, instead of performing step S502, a step S1402 may be performed where the first switch 111 is placed in a non-conducting state and the second switch 112 is placed in a conductive state, as illustrated in FIG. 14. Note that steps in the flowchart illustrated in FIG. 14 other than step S1402 are the same as in FIG. 5, so description thereof will be omitted.

While description has been made by way of an embodiment regarding the electricity distribution device according to one or multiple modifications of the present disclosure, the present disclosure is not restricted by this embodiment. modifications of the present embodiment and combinations of components of different embodiments which are conceivable by one skilled in the art may be made without departing from the essence of the present disclosure, and such forms may also be included within the scope of one or multiple modes of the present disclosure.

Electricity Distribution Device According to First Mode of Present Disclosure

An electricity distribution device according to a first mode of the present disclosure is an electricity distribution device connected to a system power supply and a battery pack, the electricity distribution device including:

a first connector connected to the battery pack;

a second connector connected to an externally-disposed load;

a primary power converter circuit operative to convert DC electric power discharged from the battery pack into electric power to be supplied to the load via the first connector;

a first switch operative to switch conducting and non-conducting states between the primary power converter circuit and the load; and a control circuitry operative to control the first switch to switch the conducting and non-conducting states between the primary power converter circuit and the load, wherein the control circuitry performs measurement of a fully-charged capacity of the battery pack by controlling the first switch to switch the non-conducting state, and discharging from the battery pack to the primary power convertor circuit.

Another electricity distribution device according to the first mode of the present disclosure is an electricity distribution device connected to a system power supply and a battery pack, the electricity distribution device including:

a first connector connected to the battery pack;

a second connector connected to an externally-disposed load;

a primary power converter circuit operative to convert DC electric power discharged from the battery pack into electric power to be supplied to the load via the first connector;

a first switch operative to switch conducting and non-conducting states between the primary power converter circuit and the load; and a control circuitry operative to control the first switch to switch the conducting and non-conducting states between the primary power converter circuit and the load, wherein the control circuitry causes the primary power convertor circuit to consume DC electric power discharged from the battery pack connected to the first connector, in a state where the first switch switches the non-conducting state between the primary power convertor circuit and the load has been placed, and acquires a current value over the time during the battery pack is discharged from the fully-charged state of the battery pack to an empty state, and measures the fully-charged capacity of the battery pack using the acquired current value.

According to the above mode, the primary power convertor circuit is caused to consume DC electric power discharged from the battery pack in a state where the first switch switches the non-conducting state between the primary power convertor circuit and the load. That is to say, the primary power convertor circuit is intentionally driven in an unloaded state (a state where the load is not connected to the primary power convertor circuit). Accordingly, by using the primary power convertor circuit, the DC current discharged from the battery pack is converted into electric power to be supplied to the load, thereby creating a state where the primary power convertor circuit consumes the DC electric power.

Accordingly, the primary power convertor circuit is made to consume the DC current discharged from the battery pack, and existing parts are used without providing dedicated equipment to measure the capacity in a fully-charged state of the battery pack (fully-charged capacity), so increase in the number of parts in the electricity distribution device can be prevented. As a result, increase in size and increase in cost of the device can be prevented.

In the above mode, for example, the first switch may further switch conducting and non-conducting states between the system power supply and the load, and the control circuitry may control the first switch to switch the conducting state between the system power supply and the load during normal operations, and to switch the conducting state between the primary power convertor circuit and the load in an emergency.

Another electricity distribution device according to the first mode of the present disclosure is an electricity distribution device connected to a system power supply and a battery pack, supplying electric power to a load from the system power supply during normal operations and supplying electric power to the load from the battery pack in an emergency, the electricity distribution device including:

a first connector connected to the battery pack;

a second connector connected to the load;

a primary power converter circuit operative to convert DC electric power discharged from the battery pack into electric power to be supplied to the load via the first connector;

a first switch operative to switch conducting and non-conducting states between the system power supply and the load, and also switches conducting and non-conducting states between the primary power convertor circuit and the load; and a control circuitry operative to control the first switch to switch the conducting state between the system power supply and the load during normal operations, and to switch the conducting state between the primary power convertor circuit and the load in an emergency, wherein the control circuitry causes the primary power convertor circuit to consume DC electric power discharged from the battery pack connected to the first connector, in a state where the first switch switches the non-conducting state between the primary power convertor circuit and the load has been placed, and acquires a current value over the time when discharging from the fully-charged state of the battery pack to an empty state, and measures the capacity of the battery pack in the fully-charged state using the acquired current value.

According to the above mode, the primary power convertor circuit is caused to consume DC electric power discharged from the battery pack in a state where the first switch switches the non-conducting state between the primary power convertor circuit and the load. That is to say, the primary power convertor circuit is intentionally driven in an unloaded state (a state where the load is not connected to the primary power convertor circuit). Accordingly, by using the primary power convertor circuit, the DC current discharged from the battery pack is converted into electric power to be supplied to the load, thereby creating a state where the primary power convertor circuit consumes the DC electric power.

Accordingly, the primary power convertor circuit is made to consume the DC current discharged from the battery pack, and existing parts are used without providing dedicated equipment to measure the capacity in a fully-charged state of the battery pack (fully-charged capacity), so increase in the number of parts in the electricity distribution device can be prevented. As a result, increase in size and increase in cost of the device can be prevented.

In the above mode, for example, the control circuitry may measure the fully-charged capacity of the battery pack, using a current value acquired between a second voltage value and a first voltage value lower than the second voltage value, between a maximum voltage value and a minimum voltage value at the battery pack.

In the above mode, for example, the second voltage value may be a voltage value corresponding to 80% to 95% of the maximum voltage value, and the first voltage value is a voltage value corresponding to 5% to 20% of the maximum voltage value.

According to the above mode, measuring the capacity of the battery pack in the fully-charged state using current values acquired between the maximum voltage value (voltage value in the fully-charged state) and minimum voltage value (voltage value in the empty state) of the battery pack may necessitate a long period for acquiring the current. According to the present mode, the fully-charged capacity of the battery pack is measured using the current value acquired between the first voltage value and the second voltage value, between the maximum voltage value and the minimum voltage value at the battery pack.

By setting the first voltage value and the second voltage value as described above can reduce the period for acquiring the current value, when the battery pack discharges from the fully-charged state to the empty state. Accordingly, the measurement can be performed faster as compared to a case of discharging the battery pack from the fully-charged state to the completely empty state.

Also, the battery pack is discharged to the second voltage value, and the capacity of the battery pack when in the fully-charged state is measured. Accordingly, charge remains in the battery pack even at the point when diagnosis of the battery pack ends. Thus, even in a case where a power outage or the like occurs when diagnosis of the battery pack ends, a minimum amount of electric power can be secured to supply to the load.

In the above mode, for example, the control circuitry may further measure output voltage from the primary power convertor circuit at the time of the primary power convertor circuit consuming DC electric power discharged from the battery pack in a state where the first switch switches the non-conducting state between the primary power convertor circuit and the load has been placed, and diagnosis whether or not there is any abnormality in the primary power convertor circuit.

According to the above mode, not only can capacity of the battery pack be measured, but also malfunctions of the primary power convertor circuit can be diagnosed.

In the above mode, for example, the electricity distribution device may further include a plurality of the connector, wherein each of the plurality of the connectors is connected to one each of a plurality of the battery pack, in parallel,
and wherein the control circuitry performs the measurement by discharging from one of the battery packs out of the plurality of battery packs to primary power convertor circuit.

According to the above mode, in a case where an emergency occurs while diagnosis of one battery pack is being performed, this battery pack cannot be used if the charge level of the battery pack is low. Accordingly, the remaining multiple battery packs can be used to supply electric power to the load.

Now, giving thought to the number of the multiple battery packs, in a case where the number of battery packs is two, for example, one out of the two battery packs is unusable, so 50% of the total capacity of the battery packs is available. Also, in a case where the number of battery packs is three, for example, one out of the three battery packs is unusable, so 66% of the total capacity of the battery packs is available. Accordingly, the electricity distribution device preferably has three or more battery packs, exceeding half the entire capacity of the battery packs.

In the above mode, for example, the control circuitry may perform the measurement of one battery pack, and thereafter perform measurement of another battery pack.

In the above mode, for example, the electricity distribution device may further include a display, and the control circuitry may display information indicating a battery pack of which the fully-charged capacity is below a predetermined value at the display.

In the above mode, for example, the electricity distribution device may further include a fan operative to cool the primary power convertor circuit, the control circuitry measuring the load current value at the time of supplying the electric power of the battery pack to the load, thereby diagnosing whether or not there is an abnormality at the fan.

In the above mode, for example, the primary power convertor circuit may be a DC/AC inverter operative to convert DC electric power discharged from the battery pack into AC electric power.

In the above mode, for example, the electricity distribution device may further include:
a receiver operative to receive external information,
wherein the control circuitry measures the fully-charged capacity of the battery pack at any timing based on information that the receiver receives.

In the above mode, for example, the control circuitry may further perform the measurement at any timing based on information internally obtained from the electricity distribution device.

Electricity Distribution Device According to Second Mode of Present Disclosure

An electricity distribution device according to a second mode of the preset disclosure is
an electricity distribution device connected to a system power supply and a battery pack, the electricity distribution device comprising:
a first connector connected to the battery pack;
a second connector connected to an externally-disposed load;
a primary power converter circuit operative to convert DC electric power discharged from the battery pack into electric power to be supplied to the load via the first connector;
a secondary power convertor circuit operative to convert AC electric power supplied from the system power supply into DC electric power charged to the battery pack;
a first switch operative to switch conducting and non-conducting states between the primary power converter circuit and the load;
a second switch operative to switch conducting and non-conducting states between the primary power convertor circuit and the battery pack;
a third switch operative to switch conducting and non-conducting states between the system power supply and the secondary power convertor circuit; and
a control circuitry operative to control the first switch, the second switch, and the third switch,
wherein the control circuitry performs measurement of a fully-charged capacity of the battery pack by
first, controlling the first switch to switch the non-conducting state between the primary power convertor circuit and the load, controlling the second switch to switch the conducting state between the primary power convertor circuit and the battery pack in a, controlling the third switch to switch the non-conducting state between the system power supply and the secondary power convertor circuit, and discharging the battery pack from a fully-charged state of the battery pack to an empty state,
causing the primary power convertor circuit to consume DC electric power discharged from the battery pack connected to the first connector, in a state where the first switch switches the non-conducting state between the primary power convertor circuit and the load, next, controlling the first switch to switch the non-conducting state between the primary power convertor circuit and the load, controlling the second switch to switch the non-conducting state between the primary power convertor circuit and the battery pack, and controlling the third switch to switch the conducting state between the system power supply and the secondary power convertor circuit, and charging the battery pack from an empty state of the battery pack to a fully-charged state, and acquiring a current value over the time when charging from the empty state of the battery pack to the fully-charged state, and measuring the fully-charged capacity of the battery pack state using the acquired current value.

According to the above mode, the primary power convertor circuit is caused to consume DC electric power discharged from the battery pack in a state where the first switch switches the non-conducting state between the primary power convertor circuit and the load. That is to say, the primary power convertor circuit is intentionally driven in an unloaded state (a state where the load is not connected to the primary power convertor circuit). Accordingly, the DC current discharged from the battery pack is converted into electric power to be supplied to the load using the primary power convertor circuit, thereby creating a state where the primary power convertor circuit consumes the DC electric power.

In this state, the secondary power convertor circuit is used to charge the battery pack from the empty state of the battery pack to the fully-charged state, and the capacity of the battery pack is measured to the fully-charged state. That is to say, at the time of measuring the capacity of the battery pack in the fully-charged state (fully-charged capacity), the fully-charged capacity of the battery pack can be measured not only in the case of discharging from the battery pack but also in the case of charging the battery pack, by using the secondary power convertor circuit.

Accordingly, existing parts are used without providing dedicated equipment to measure the fully-charged capacity of the battery pack, so increase in the number of parts in the electricity distribution device can be prevented. As a result, increase in size and increase in cost of the device can be prevented.

In the above mode, for example, the control circuitry may measure the capacity of the battery pack in the fully-charged state, using a current value acquired between a third voltage value and a fourth voltage value higher than the third voltage value, between a maximum voltage value and a minimum voltage value at the battery pack.

In the above mode, for example, the third voltage value may be a voltage value corresponding to 0% to 20% of the maximum voltage value, and the fourth voltage value is a voltage value corresponding to 70% to 80% of the maximum voltage value.

According to the above mode, measuring the capacity of the battery pack in the fully-charged state using current values acquired between the maximum voltage value and minimum voltage value of the battery pack may make the period for acquiring the current value long.

Due to the properties of lithium-ion batteries, lithium-ion batteries can be rapidly charged from 0% of the maximum voltage up to 70% to 80%. However, beyond 70% to 80% the charging speed rapidly drops, and requires a great amount of time till reaching the fully-charged state. Accordingly, measurement of the fully-charged capacity may be performed from a value 0% to 20% of the maximum voltage (third voltage value) to a value 70% to 80% of the maximum voltage (fourth voltage value), as a substitute measurement of the fully-charged capacity. As a result, measurement can be performed quicker than performing measurement by charging a battery pack using a lithium-ion battery from the empty state to the fully-charged state.

In the above mode, for example, the control circuitry may further measure output voltage from the secondary power convertor circuit at the time of charging the battery pack from an empty state to a fully-charged state, and diagnose whether or not there is any abnormality in the secondary power convertor circuit.

According to the above mode, not only can the capacity of the battery pack be measured, but also malfunction of the secondary power convertor circuit can be diagnosed.

In the above mode, for example, the battery pack preferably is detachably electrically connected to the first connector, and the electricity distribution device further includes a storage portion operative to store the battery pack connected to the first connector.

According to the above mode, the battery pack can be easily replaced if the lifespan has expired or trouble has occurred such as a malfunction.

In the above mode, for example, the electricity distribution device further may include a plurality of the connector,
 wherein each of the plurality of the connectors is connected to one each of a plurality of the battery pack, in parallel,
 and wherein the control circuitry performs the measurement by discharging from one of the battery packs out of the plurality of battery packs to the primary power convertor circuit.

According to the above mode, in a case where an emergency occurs while diagnosis of one battery pack is being performed, this battery pack cannot be used if the charge level of the battery pack is low. Accordingly, the remaining multiple battery packs can be used to supply electric power to the load.

Now, giving thought to the number of the multiple battery packs, in a case where the number of battery packs is two, for example, one out of the two battery packs is unusable, so 50% of the total capacity of the battery packs is available. Also, in a case where the number of battery packs is three, for example, one out of the three battery packs is unusable, so 66% of the total capacity of the battery packs is available. Accordingly, the electricity distribution device preferably has three or more battery packs, exceeding half the entire capacity of the battery packs.

In the above mode, for example, after having performed the measurement of the one battery pack, the control circuitry may perform measurement of another of the battery packs.

In the above mode, for example, the electricity distribution device may further include a display, the control circuitry causing the display to display information indicating the battery packs of which the fully-charged capacity are below a predetermined value.

In the above mode, for example, the electricity distribution device may further include a fan operative to cool the power converter unit, the control circuitry measuring a load current value when supplying electric power of the battery pack to the load, and diagnoses whether or not there is any abnormality in the fan.

In the above mode, for example, the primary power convertor circuit may be a DC/AC converter operative to convert DC electric power discharged from the battery pack into AC electric power.

In the above mode, for example, the electricity distribution device may further include:

a receiver operative to receive external information, wherein the control circuitry measures the fully-charged capacity of the battery pack at any timing based on information that the receiver receives.

In the above mode, for example, the control circuitry may further perform the measurement at any timing based on information internally obtained from the electricity distribution device.

Diagnosis Method of Battery Pack According to Third Mode of Present Disclosure

The controlling method of a battery pack according to a third mode of the present disclosure is a diagnosis method of a battery pack disposed in an electricity distribution device connected to a system power supply, the electricity distribution device including a first connector connected to the battery pack, a second connector connected to an externally-disposed load, a primary power converter circuit operative to convert DC electric power discharged from the battery pack into electric power to be supplied to the load via the first connector, a first switch operative to switch conducting and non-conducting states between the primary power converter circuit and the load, and a control circuitry operative to control the first switch to switch the conducting and non-conducting states between the primary power converter circuit and the load, the method including:

performing measurement of a fully-charged capacity of the battery pack by consuming DC electric power, discharged from the battery pack connected to the first connector, by the primary power convertor circuit, in a state where the first switch switches the non-conducting state between the primary power convertor circuit and the load, and acquiring a current value over the time when discharging from the fully-charged state of the battery pack to an empty state, and measuring the fully-charged capacity of the battery pack using the acquired current value.

In the above mode, for example, the method may further include, in the acquiring, a first determining of the control circuitry determining whether or not self-sustaining operations are being performed at the electricity distribution device; and stopping of the acquiring in a case where determination is made in the determining that self-sustaining operations are being performed.

In the above mode, for example, the electricity distribution device further includes a plurality of the connector, wherein each of the plurality of the connectors is connected to one each of a plurality of the battery pack, in parallel, and wherein the control circuitry performs the measurement by discharging from one of the battery packs out of the plurality of battery packs to the primary power convertor circuit.

According to the above mode, in a case where an emergency occurs while diagnosis of one battery pack is being performed, this battery pack cannot be used if the charge level of the battery pack is low. Accordingly, the remaining multiple battery packs can be used to supply electric power to the load.

Now, giving thought to the number of the multiple battery packs, in a case where the number of battery packs is two, for example, one out of the two battery packs is unusable, so 50% of the total capacity of the battery packs is available. Also, in a case where the number of battery packs is three, for example, one out of the three battery packs is unusable, so 66% of the total capacity of the battery packs is available. Accordingly, the electricity distribution device preferably has three or more battery packs, exceeding half the entire capacity of the battery packs.

In the above mode, for example, after having performed the measurement of the one battery pack, the control circuitry may perform measurement of another of the battery packs.

In the above mode, for example, the electricity distribution device may further include a display, the control circuitry causing the display to display information indicating the battery packs of which the fully-charged capacity are below a predetermined value.

In the above mode, for example, the electricity distribution device may further include a fan operative to cool the power converter unit, the control circuitry measuring a load current value when supplying electric power of the battery pack to the load, and diagnoses whether or not there is any abnormality in the fan.

In the above mode, for example, the primary power convertor circuit may be a DC/AC inverter operative to convert DC electric power discharged from the battery pack into AC electric power.

In the above mode, for example, the electricity distribution device may further include:

a receiver operative to receive external information, wherein the control circuitry measures the fully-charged capacity of the battery pack at any timing based on information that the receiver receives.

In the above mode, for example, the control circuitry may further perform the measurement at any timing based on information internally obtained from the electricity distribution device.

Also provided may be a program for causing a computer to realize the diagnosis method according to the above-described mode.

Also provided may be a computer-readable recording medium in which is recorded program for causing a computer to realize the diagnosis method according to the above-described mode.

Diagnosis Method of Battery Pack According to Fourth Mode of Present Disclosure

The controlling method of a battery pack according to a fourth mode of the present disclosure is a diagnosis method of a battery pack disposed in an electricity distribution device connected to a system power supply, the electricity distribution device including a first connector connected to the battery pack, a second connector connected to an externally-disposed load, a primary power converter circuit operative to convert DC electric power discharged from the battery pack into electric power to be supplied to the load via the second connector, a secondary power convertor circuit operative to convert AC electric power supplied from the system power supply into DC electric power charged to the battery pack, a first switch operative to switch conducting and non-conducting states between the primary power converter circuit and the load, a second switch operative to switch conducting and non-conducting states between the primary power convertor circuit and the battery pack, a third switch operative to switch conducting and non-conducting states between the system power supply and the secondary power convertor circuit, and a control circuitry operative to control the first switch, the second switch, and the third switch, the method comprising:

performing measurement of a fully-charged capacity of the battery pack by first, controlling the first switch to switch the non-conducting state between the primary power convertor circuit and the load controlling the second to switch the conducting state between the primary power convertor circuit and the battery pack, controlling the third switch to switch the non-conducting state between the system power supply and the secondary power convertor circuit, and discharging the battery pack from a fully-charged state of the battery pack to an empty state, consuming DC electric power, discharged from the battery pack connected to the first connector, at the primary power convertor circuit, in a state where the first switch switches the non-conducting state between the primary power convertor circuit and the load, next, controlling the first switch to switch the non-conducting state between the primary power convertor circuit and the load, controlling the second switch to switch the non-conducting state between the primary power convertor circuit and the battery pack, and controlling the third switch to switch the conducting state between the system power supply and the secondary power convertor circuit, and charging the battery pack from an empty state of the battery pack to a fully-charged state, and acquiring a current value over the time when charging from the empty state of the battery pack to the fully-charged state, and measures the fully-charged capacity of the battery pack using the acquired current value.

In the above mode, for example, the method may further include, in the acquiring, a first determining of the control circuitry determining whether or not self-sustaining operations are being performed at the electricity distribution device; and stopping of the acquiring in a case where determination is made in the determining that self-sustaining operations are being performed.

In the above mode, for example, the electricity distribution device may further include a plurality of the connector, wherein each of the plurality of the connectors is connected to one each of a plurality of the battery pack, in parallel, and wherein the control circuitry performs the measurement by discharging from one of the battery packs out of the plurality of battery packs to the primary power convertor circuit.

According to the above mode, in a case where an emergency occurs while diagnosis of one battery pack is being performed, this battery pack cannot be used if the charge level of the battery pack is low. Accordingly, the remaining multiple battery packs can be used to supply electric power to the load.

Now, giving thought to the number of the multiple battery packs, in a case where the number of battery packs is two, for example, one out of the two battery packs is unusable, so 50% of the total capacity of the battery packs is available. Also, in a case where the number of battery packs is three, for example, one out of the three battery packs is unusable, so 66% of the total capacity of the battery packs is available. Accordingly, the electricity distribution device preferably has three or more battery packs, exceeding half the entire capacity of the battery packs.

In the above mode, for example, after having performed the measurement of the one battery pack, the control circuitry may perform measurement of another of the battery packs.

In the above mode, for example, the electricity distribution device may further include a display, the control circuitry causing the display to display information indicating the battery packs of which the fully-charged capacity are below a predetermined value.

In the above mode, for example, the electricity distribution device may further include a fan operative to cool the power converter unit, the control circuitry measuring a load current value when supplying electric power of the battery pack to the load, and diagnoses whether or not there is any abnormality in the fan.

In the above mode, for example, the primary power convertor circuit may be a DC/AC inverter operative to convert DC electric power discharged from the battery pack into AC electric power.

In the above mode, for example, the electricity distribution device may further include:

a receiver operative to receive external information, wherein the control circuitry measures the fully-charged capacity of the battery pack at any timing based on information that the receiver receives.

In the above mode, for example, the control circuitry may further perform the measurement at any timing based on information internally obtained from the electricity distribution device.

Also provided may be a program for causing a computer to realize the diagnosis method according to the above-described mode.

Also provided may be a computer-readable recording medium in which is recorded program for causing a computer to realize the diagnosis method according to the above-described mode.

Electricity Distribution Device According to Fifth Mode of Present Disclosure

The electricity distribution device according to a fifth mode of the present disclosure is an electricity distribution device that is connected to a system power supply operative to supply electric power from a battery pack to a load during self-sustaining operations, the electricity distribution device including connectors to which electrode terminals of the battery pack are electrically connected, a charging unit, a power converter unit, a first switch, a second switch, and a control circuitry, wherein the charging unit converts AC electric power supplied from the system power supply into DC electric power, and charges the battery pack with this DC electric power, wherein the power converter unit converts DC electric power discharged from the battery pack into electric power to be supplied to the load, wherein the first switch switches conducting and non-conducting states between the power converter unit and the load, wherein the second switch switches conducting and non-conducting states between the connectors and the power converter unit, and wherein the control circuitry measures the fully-charged capacity of the battery pack by controlling the first switch to switch the non-conducting state, controlling the second switch to switch the conducting state, and discharging from the battery pack to the power converter unit.

In the above mode, for example, after having fully charged the battery pack, the control circuitry may acquire the discharge amount of when discharging from the battery pack to the power converter unit, thereby performing the measurement.

In the above mode, for example, with regard to properties representing the relationship between voltage and SOC when discharging a battery from a fully-charged state to an empty state, in a case where a region in which the SOC of the battery is high and in which the voltage of the battery rapidly drops in conjunction with decrease in the SOC is called a high-SOC region, a region in which the SOC is lower than the high-SOC region and in which the voltage of the battery drops less rapidly than in the high-SOC region is called a mid-SOC region, and a region in which the SOC is lower than the mid-SOC region and in which the voltage of the battery drops more rapidly in conjunction with decrease in the SOC than the mid-SOC region is called a low-SOC region, the control circuitry may perform the measurement by acquiring the discharge amount when the battery pack discharges to the power converter unit from the high-SOC region to the low-SOC region.

In the above mode, for example, after having fully discharged the battery pack to an empty state, the control circuitry may acquire the charge amount of when charging from the charging unit to the battery pack, thereby performing the measurement.

In the above mode, for example, with regard to properties representing the relationship between voltage and SOC when charging a battery from an empty state to a fully-charged state, in a case where a region in which the SOC of the battery is low and in which the voltage of the battery rapidly rises in conjunction with increase in the SOC is called a low-SOC region, a region in which the SOC is higher than the low-SOC region and in which the voltage of the battery rises less rapidly than in the low-SOC region is called a mid-SOC region, and a region in which the SOC is higher than the mid-SOC region and in which the voltage of the battery rises more rapidly in conjunction with increase in the SOC than the mid-SOC region is called a high-SOC region, the control circuitry may perform the measurement by acquiring the charge amount when the battery pack is charged by the charging unit from the low-SOC region to the high-SOC region.

In the above mode, for example, the electricity distribution device may further include a plurality of the connector, wherein each of the plurality of the connectors is connected to one each of a plurality of the battery pack, in parallel, and wherein the control circuitry performs the measurement by discharging from one of the battery packs out of the plurality of battery packs to the power convertor unit.

In the above mode, for example, the control circuitry may perform the measurement of one battery pack, and thereafter perform measurement of another battery pack.

In the above mode, for example, the electricity distribution device may further include a third switch operative to switch conducting and non-conducting states between the system power supply and the AC/DC converter, wherein the control circuitry performs the measurement by controlling the first switch and the third switch to the non-conducting state, and controls the second switch to the conducting state.

In the above mode, for example, the first switch may further switch conducting and non-conducting states of the load and the system power supply, and switch the connection of the load to either of the power converter unit and the system power supply.

In the above mode, for example, the electricity distribution device may further include:

a fourth switch operative to switch conducting and non-conducting states of the system power supply and the load, wherein the control circuitry performs the measurement by controlling the first switch and the third switch to switch the non-conducting state, and controls the second switch and the fourth switch to switch the conducting state.

In the above mode, for example, the connector may be detachably electrically connected to the battery pack, and the electricity distribution device may further include a storage portion operative to store the battery pack connected to the connector.

In the above mode, for example, the electricity distribution device may further include:

a display, wherein the control circuitry causes the display to display information indicating a battery pack of which the fully-charged capacity is below a predetermined value.

In the above mode, for example, the control circuitry may further measure unloaded voltage at the time of supplying the electric power of the battery pack to the power converter unit, and diagnose whether or not there is an abnormality at the power converter unit.

In the above mode, for example, the electricity distribution device may further include:

a fan operative to cool the power converter unit, wherein the control circuitry measures a load current value when supplying electric power of the battery pack to the load, and diagnoses whether or not there is any abnormality in the fan.

In the above mode, for example, the control circuitry may further measure values related to charging when the battery pack is charged from an empty state to a fully-charged state, and diagnose whether or not there is an abnormality at the AC/DC converter.

In the above mode, for example, the power converter may be a DC/AC inverter operative to convert DC electric power discharged from the battery pack into AC electric power.

In the above mode, for example, the electricity distribution device may further include:

a receiver operative to receive external information, wherein the control circuitry measures the fully-charged capacity of the battery pack at any timing based on information that the receiver receives.

In the above mode, for example, the control circuitry may further perform the measurement at any timing based on information internally obtained from the electricity distribution device.

Diagnosis Method According to Sixth Mode of Present Disclosure

The diagnosis method according to a sixth mode of the present disclosure is a diagnosis method of a battery pack by an electricity distribution device including a connector by which the battery pack is electrically connected, a charging unit operative to convert AC electric power supplied from the system power supply into DC electric power, and charges the battery pack, a power converter unit operative to convert DC electric power discharged from the battery pack into electric power to be supplied to the load, a first switch operative to switch conducting and non-conducting states between the power converter unit and the load, a second switch operative to switch conducting and non-conducting states between the connector and the power converter unit, and a control circuitry, the method including:

switching of the control circuitry controlling the first switch to switch the non-conducting state, and controlling the second switch to switch the conducting state;

acquiring of the control circuitry acquiring, after the switching, a discharge amount when discharge is performed from the battery pack to the power convertor unit or a charging amount when charging is performed from the charging unit to the battery pack, and calculating of the control circuitry calculating a fully-charged capacity of the battery pack based on the discharge amount or charging amount acquired in the acquiring.

In the above mode, for example, the method may further include, in the acquiring, first determining of the control circuitry determining whether or not self-sustaining operations are being performed at the electricity distribution device; and stopping of the acquiring in a case where determination is made in the determining that self-sustaining operations are being performed.

The present disclosure is advantageous as an electricity distribution device which can determine whether the fully-charged capacity of a battery pack is sufficient, without providing dedicated equipment to measure the fully-charged capacity of the battery pack.

What is claimed is:

1. An electricity distribution device connected to a system power supply and a battery pack, the electricity distribution device comprising:
a first connector connected to the battery pack;
a second connector connected to an externally-disposed load;
a primary power converter circuit operative to convert DC electric power discharged from the battery pack into electric power to be supplied to the load via the first connector;
a first switch operative to switch conducting and non-conducting states between the primary power converter circuit and the load; and
a control circuitry operative to control the first switch to switch the conducting and non-conducting states between the primary power converter circuit and the load,
wherein the control circuitry performs measurement of a fully-charged capacity of the battery pack by controlling the first switch to switch the non-conducting state and discharging from the battery pack to the primary power convertor circuit.

2. The electricity distribution device according to claim 1, wherein, in a case of performing diagnosis of the battery pack, the control circuitry
causes the primary power convertor circuit to consume DC electric power discharged from the battery pack connected to the first connector, in a state where the first switch switches the non-conducting state between the primary power convertor circuit and the load has been placed, and
acquires a current value over the time when discharging from the fully-charged state of the battery pack to an empty state, and measures the fully-charged capacity of the battery pack using the acquired current value.

3. The electricity distribution device according to claim 1, wherein the first switch further switches the conducting and non-conducting states between the system power supply and the load, and
wherein the control circuitry controls the first switch to switch the conducting state between the system power supply and the load during normal operations, and to switch the conducting state between the primary power convertor circuit and the load in an emergency.

4. The electricity distribution device according to claim 1, wherein the control circuitry causes the first switch to switch the conducting state between the system power supply and the load during the normal operations, and to switch the conducting state between the primary power convertor circuit and the load in the emergency.

5. The electricity distribution device according to claim 1, wherein the control circuitry measures the fully-charged capacity of the battery pack, using a current value acquired between a second voltage value and a first voltage value lower than the second voltage value, between a maximum voltage value and a minimum voltage value at the battery pack.

6. The electricity distribution device according to claim 5, wherein the second voltage value is a voltage value corresponding to 80% to 95% of the maximum voltage value, and the first voltage value is a voltage value corresponding to 5% to 20% of the maximum voltage value.

7. The electricity distribution device according to according to claim 1,
wherein the control circuitry further measures output voltage from the primary power convertor circuit at the time of the primary power convertor circuit consuming DC electric power discharged from the battery pack in a state where the first switch switches the non-conducting state between the primary power convertor circuit and the load has been placed, and diagnosis whether or not there is any abnormality in the primary power convertor circuit.

8. An electricity distribution device connected to a system power supply and a battery pack, the electricity distribution device comprising:
a first connector connected to the battery pack;
a second connector connected to an externally-disposed load;
a primary power converter circuit operative to convert DC electric power discharged from the battery pack into electric power to be supplied to the load via the first connector;
a secondary power convertor circuit operative to convert AC electric power supplied from the system power supply into DC electric power charged to the battery pack;
a first switch operative to switch conducting and non-conducting states between the primary power converter circuit and the load;
a second switch operative to switch conducting and non-conducting states between the primary power convertor circuit and the battery pack;

a third switch operative to switch conducting and non-conducting states between the system power supply and the secondary power convertor circuit; and a control circuitry operative to control the first switch, the second switch, and the third switch, wherein the control circuitry performs measurement of a fully-charged capacity of the battery pack by first, controlling the first switch to switch the non-conducting state between the primary power convertor circuit and the load, controlling the second switch to switch the conducting state between the primary power convertor circuit and the battery pack, controlling the third switch to switch the non-conducting state between the system power supply and the secondary power convertor circuit, and discharging the battery pack from a fully-charged state of the battery pack to an empty state, causing the primary power convertor circuit to consume DC electric power discharged from the battery pack connected to the first connector, in a state where between the primary power convertor circuit and the load is in a non-conducting state, next, controlling the first switch to switch the non-conducting state between the primary power convertor circuit and the load, controlling the second switch to switch the non-conducting state between the primary power convertor circuit and the battery pack, and controlling the third switch to switch the conducting state between the system power supply and the secondary power convertor circuit, and charging the battery pack from an empty state of the battery pack to a fully-charged state, and acquiring a current value over the time during which the battery pack is charged from the empty state of the battery pack to the fully-charged state and measuring the fully-charged capacity of the battery pack using the acquired current value.

9. The electricity distribution device according to claim 8, wherein the control circuitry measures the fully-charged capacity of the battery pack, using a current value acquired between a third voltage value and a fourth voltage value higher than the third voltage value, between a maximum voltage value and a minimum voltage value at the battery pack.

10. The electricity distribution device according to claim 9, wherein the third voltage value is a voltage value corresponding to 0% to 20% of the maximum voltage value, and the fourth voltage value is a voltage value corresponding to 70% to 80% of the maximum voltage value.

11. The electricity distribution device according to claim 9, wherein the control circuitry further measures output voltage from the secondary power convertor circuit at the time of charging the battery pack from an empty state to a fully-charged state, and diagnoses whether or not there is any abnormality in the secondary power convertor circuit.

12. The electricity distribution device according to according to claim 1, further comprising:
a storage portion operative to store the battery pack, in a state where the battery pack is detachably electrically connected to the first connector.

13. The electricity distribution device according to claim 1, further comprising:
a plurality of the connector,
wherein each of the plurality of the connectors is connected to one each of a plurality of the battery pack, in parallel, and
wherein the control circuitry performs the measurement by discharging from one of the battery packs out of the plurality of battery packs to the primary power convertor circuit.

14. The electricity distribution device according to claim 1,
wherein, after having performed the measurement of the one battery pack, the control circuitry performs measurement of another of the battery packs.

15. The electricity distribution device according to claim 1, further comprising:
a display,
wherein the control circuitry causes the display to display information indicating the battery packs of which the fully-charged capacity are below a predetermined value.

16. The electricity distribution device according to claim 1, further comprising:
a fan operative to cool the power converter unit,
wherein the control circuitry measures a load current value when supplying electric power of the battery pack to the load, and diagnoses whether or not there is any abnormality in the fan.

17. The electricity distribution device according to claim 1, further comprising:
a receiver operative to receive external information,
wherein the control circuitry measures the fully-charged capacity of the battery pack at any timing based on information that the receiver receives.

18. The electricity distribution device according to claim 1,
wherein the control circuitry further performs the measurement at any timing based on information internally obtained from the electricity distribution device.

19. A controlling method of a battery pack disposed in an electricity distribution device connected to a system power supply, the electricity distribution device including
a first connector connected to the battery pack,
a second connector connected to an externally-disposed load,
a primary power converter circuit operative to convert DC electric power discharged from the battery pack into electric power to be supplied to the load via the first connector,
a first switch operative to switch conducting and non-conducting states between the primary power converter circuit and the load, and
a control circuitry operative to cause the first switch to conduct between the primary power converter circuit and the load,
the method comprising:
performing measurement of a fully-charged capacity of the battery pack by
consuming DC electric power, discharged from the battery pack connected to the first connector, by the primary power convertor circuit, in a state where the first switch switches the non-conducting state between the primary power convertor circuit and the load, and
acquiring a current value over the time during which the battery pack is discharged from the fully-charged state of the battery pack to an empty state and measuring the fully-charged capacity of the battery pack using the acquired current value.

20. A controlling method of a battery pack disposed in an electricity distribution device connected to a system power supply, the electricity distribution device including
- a first connector connected to the battery pack,
- a second connector connected to an externally-disposed load,
- a primary power converter circuit operative to convert DC electric power discharged from the battery pack into electric power to be supplied to the load via the second connector,
- a secondary power convertor circuit operative to convert AC electric power supplied from the system power supply into DC electric power charged to the battery pack,
- a first switch operative to switch conducting and non-conducting states between the primary power converter circuit and the load,
- a second switch operative to switch conducting and non-conducting states between the primary power convertor circuit and the battery pack,
- a third switch operative to switch conducting and non-conducting states between the system power supply and the secondary power convertor circuit, and
- a control circuitry operative to control the first switch, the second switch, and the third switch, the method comprising:

performing measurement of a fully-charged capacity of the battery pack by first, controlling the first switch to switch the non-conducting state between the primary power convertor circuit and the load, controlling the second switch to switch the conducting state between the primary power convertor circuit and the battery pack, controlling the third switch to switch the non-conducting state between the system power supply and the secondary power convertor circuit, and discharging the battery pack from a fully-charged state of the battery pack to an empty state, consuming DC electric power, discharged from the battery pack connected to the first connector, at the primary power convertor circuit, in a state where between the primary power convertor circuit and the load is in a non-conducting state, next, controlling the first switch to switch the non-conducting state between the primary power convertor circuit and the load, controlling the second switch to switch the non-conducting state between the primary power convertor circuit and the battery pack, and controlling the third switch to switch the conducting state between the system power supply and the secondary power convertor circuit, and charging the battery pack from an empty state of the battery pack to a fully-charged state, and acquiring a current value over the time during which the battery pack is charged from the empty state of the battery pack to the fully-charged state and measuring the fully-charged capacity of the battery pack using the acquired current value.

* * * * *